(12) United States Patent
Ra et al.

(10) Patent No.: US 11,678,536 B2
(45) Date of Patent: Jun. 13, 2023

(54) ORGANIC LIGHT EMITTING DISPLAY DEVICE MAINTAINING CONSTANT CAPACITANCE OF A CAPACITOR DESPITE MASK MISALIGNMENT

(71) Applicant: Samsung Display Co., Ltd., Yongin-si (KR)

(72) Inventors: Yoo Mi Ra, Ansan-si (KR); Kyung-Ho Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 45 days.

(21) Appl. No.: 17/234,454

(22) Filed: Apr. 19, 2021

(65) Prior Publication Data

US 2021/0408209 A1     Dec. 30, 2021

(30) Foreign Application Priority Data

Jun. 26, 2020   (KR) ........................ 10-2020-0078392

(51) Int. Cl.
  *G09G 3/3266*   (2016.01)
  *H01L 27/32*    (2006.01)
  *G09G 3/3291*   (2016.01)

(52) U.S. Cl.
  CPC ....... *H01L 27/3276* (2013.01); *G09G 3/3266* (2013.01); *G09G 3/3291* (2013.01); *H01L 27/3262* (2013.01)

(58) Field of Classification Search
  CPC .......... G09G 3/30; G09G 3/32; G09G 3/3208; G09G 3/3216; G09G 3/3225;
  (Continued)

(56) References Cited

U.S. PATENT DOCUMENTS 10,650,749 B2   5/2020   Cho et al.
11,024,691 B2   6/2021   Kim et al.
                (Continued)

FOREIGN PATENT DOCUMENTS

EP      3 648 169 A1    5/2020
KR    10-0838185 B1     6/2008
                (Continued)

OTHER PUBLICATIONS

PCT Search Report issued in PCT Application No. PCT/KR2021/007938 dated Oct. 25, 2021, 3 pages.

*Primary Examiner* — Amit Chatly
*Assistant Examiner* — Nelson Lam
(74) *Attorney, Agent, or Firm* — Lewis Roca Rothgerber Christie LLP

(57) ABSTRACT

A display device includes: a substrate; a driving voltage line and a data line that are on the substrate; a semiconductor layer that includes a first electrode, a channel, and a second electrode of a driving transistor, the driving transistor being connected to the driving voltage line; a gate electrode of the driving transistor overlapping the channel; a lower storage electrode extending from the gate electrode; and an upper storage electrode overlapping the lower storage electrode, wherein the semiconductor layer further includes a first electrode, a channel, and a second electrode of a switching transistor, the switching electrode being connected between the lower storage electrode and the data line, the upper storage electrode does not overlap the channel of the driving transistor, the lower storage electrode includes a first portion and a second portion that are at opposite sides of the gate electrode.

20 Claims, 21 Drawing Sheets

(58) Field of Classification Search
CPC .. G09G 3/3233; G09G 3/3258; G09G 3/3266; G09G 3/3275; G09G 3/3283; G09G 3/3291
USPC .................................................. 345/76–83
See application file for complete search history.

(56) References Cited

U.S. PATENT DOCUMENTS

| | | | |
|---|---|---|---|
| 11,508,318 B2* | 11/2022 | Ra | H01L 27/3276 |
| 2005/0068272 A1* | 3/2005 | Yoneda | H01L 27/12 |
| | | | 257/E27.111 |
| 2005/0242745 A1* | 11/2005 | Jung | G09G 3/3233 |
| | | | 313/496 |
| 2008/0007492 A1* | 1/2008 | Koh | H01L 27/3276 |
| | | | 345/76 |
| 2009/0128458 A1* | 5/2009 | Kim | H01L 27/3211 |
| | | | 345/76 |
| 2010/0079419 A1* | 4/2010 | Shibusawa | H01L 27/3272 |
| | | | 345/204 |
| 2011/0273410 A1* | 11/2011 | Park | H01L 24/95 |
| | | | 345/82 |
| 2013/0147692 A1* | 6/2013 | Yamashita | G09G 3/3233 |
| | | | 345/76 |
| 2014/0125565 A1* | 5/2014 | Chang | H01L 27/1237 |
| | | | 345/76 |
| 2015/0042634 A1* | 2/2015 | Jin | H01L 27/3272 |
| | | | 345/82 |
| 2019/0305062 A1 | 10/2019 | Wang et al. | |
| 2020/0135831 A1 | 4/2020 | Bae et al. | |
| 2022/0180818 A1* | 6/2022 | Ra | G09G 3/3233 |

FOREIGN PATENT DOCUMENTS

| | | |
|---|---|---|
| KR | 10-2016-0049408 A | 5/2016 |
| KR | 10-2017-0133538 A | 12/2017 |
| KR | 10-2018-0078427 | 7/2018 |
| KR | 10-2018-0112193 | 10/2018 |
| KR | 10-2019-0068333 A | 6/2019 |
| KR | 10-2083639 B1 | 3/2020 |
| KR | 10-2020-0047834 | 5/2020 |

\* cited by examiner

ORGANIC LIGHT EMITTING DISPLAY DEVICE MAINTAINING CONSTANT CAPACITANCE OF A CAPACITOR DESPITE MASK MISALIGNMENT

CROSS-REFERENCE TO RELATED APPLICATION

This application claims priority to and the benefit of Korean Patent Application No. 10-2020-0078392 filed in the Korean Intellectual Property Office (KIPO) on Jun. 26, 2020, the entire content of which is incorporated by reference herein.

BACKGROUND

1. Field

The present disclosure relates to a display device.

2. Description of the Related Art

An organic light emitting display includes two electrodes and an organic emission layer positioned between the two electrodes. Electrons injected from one electrode and holes injected from the other electrode are combined in the organic emission layer, thereby forming excitons. As the excitons change from an excited state to a ground state, they emit energy and emit light.

Such an organic light emitting display includes a plurality of pixels each including an organic light emitting diode, which is a self-emissive element. A plurality of transistors and at least one capacitor are formed in each pixel to drive the organic light emitting diode. The plurality of transistors may include a switching transistor and a driving transistor.

The transistors and the capacitor may be formed through several photolithography and etching processes. In this case, an overlapped area between the two electrodes forming the capacitor may vary due to misalignment of the mask, and thus the capacitance of the capacitor may fluctuate.

The above information disclosed in this Background section is only for enhancement of understanding of the background of the described technology, and therefore it may contain information that does not form prior art.

SUMMARY

Aspects of one or more exemplary embodiments of the present disclosure are directed towards a display device that can maintain constant or substantially constant capacitance of a capacitor at a suitable value even though mask misalignment occurs.

A display device according to an exemplary embodiment includes: a substrate; a driving voltage line on the substrate; a data line on the substrate; a semiconductor layer including a first electrode of a driving transistor, a channel of the driving transistor, and a second electrode of the driving transistor, the driving transistor being connected to the driving voltage line; a gate electrode of the driving transistor overlapping the channel of the driving transistor; a lower storage electrode extending from the gate electrode of the driving transistor; and an upper storage electrode overlapping the lower storage electrode, wherein the semiconductor layer further includes a first electrode of a switching transistor, a channel of the switching transistor, and a second electrode of the switching transistor, the switching transistor being connected between the lower storage electrode and the data line, the upper storage electrode does not overlap the channel of the driving transistor, the lower storage electrode comprises a first portion and a second portion that are at opposite sides of the gate electrode of the driving transistor, and the upper storage electrode overlaps the first portion of the lower storage electrode and the second portion of the lower storage electrode.

The channel of the driving transistor has a polygonal shape, the channel of the driving transistor including a first edge and a second edge opposite each other, a third edge connecting the first edge and the second edge, and a fourth edge opposite the third edge, the first portion of the lower storage electrode may be adjacent to the first edge of the channel of the driving transistor, the second portion of the lower storage electrode may be adjacent to the second edge of the channel of the driving transistor, and the upper storage electrode may be adjacent to the first edge, the second edge, and the third edge of the channel of the driving transistor in a plan view.

The first portion of the lower storage electrode may be substantially equal in width to the second portion of the lower storage electrode.

The upper storage electrode may not surround the fourth edge of the channel of the driving transistor in the plan view, and may be spaced from the third edge of the channel of the driving transistor in the plan view.

The lower storage electrode may further include a third portion connected to the switching transistor, and a fourth portion opposite the third portion, and the upper storage electrode may overlap the third portion of the lower storage electrode and the fourth portion of the lower storage electrode.

The display device may further include a gate electrode overlapping the channel of the switching transistor, wherein the first electrode of the switching transistor may be connected to the data line, the second electrode of the switching transistor may be connected to the lower storage electrode, the channel of the switching transistor may be between the first electrode of the switching transistor and the second electrode of the switching transistor, the third portion of the lower storage electrode may overlap the second electrode of the switching transistor by extending from a bottom edge of the lower storage electrode in the plan view, and the fourth portion of the lower storage electrode may extend from a top edge of the lower storage electrode in the plan view.

The third portion of the lower storage electrode may be substantially equal in width to the fourth portion of the lower storage electrode.

The display device according to the exemplary embodiment may further include: a first connection electrode connecting the first electrode of the switching transistor and the data line; and a second connection electrode connecting the switching transistor and the lower storage electrode, wherein the first connection electrode and the second connection electrode do not overlap the channel of the switching transistor.

The first connection electrode, the second connection electrode, and the upper storage electrode may be at a same layer.

The display device according to the exemplary embodiment may further include: an initialization voltage line on the substrate; an initialization transistor connected between the initialization voltage line and the upper storage electrode; and an initialization voltage auxiliary pattern connecting the initialization transistor and the initialization voltage line, wherein the initialization transistor may include a first electrode connected to the upper storage electrode, a second electrode connected to the initialization voltage line, a channel between the first electrode of the initialization transistor and the second electrode of the initialization transistor, and a gate electrode overlapping the channel of the initialization transistor, and the initialization voltage auxiliary pattern and the upper storage electrode may not overlap the channel of the initialization transistor.

The initialization voltage auxiliary pattern and the upper storage electrode may be at a same layer.

The driving voltage line, the data line, and the initialization voltage line may extend in parallel along a first direction.

The display device according to the exemplary embodiment may further include a first scan line extending in a second direction that crosses the first direction, wherein the first scan line may be connected to the gate electrode of the switching transistor and the gate electrode of the initialization transistor.

The switching transistor and the initialization transistor may be adjacent to each other along the first direction.

The display device according to the exemplary embodiment may further include a first scan line and a second scan line extending in a second direction crossing the first direction, wherein the first scan line may be connected to the gate electrode of the switching transistor, and the second scan line may be connected to the gate electrode of the initialization transistor.

The switching transistor and the initialization transistor may be adjacent to each other along the second direction.

The data line may include a first data line, a second data line, and a third data line that are continuously arranged to be adjacent to each other, and the driving voltage line, the first data line, the second data line, and the third data line may extend in parallel along a first direction.

The display device according to the exemplary embodiment may further include: a first pixel connected to the driving voltage line and the first data line; a second pixel connected to the driving voltage line and the second data line; and a third pixel connected to the driving voltage line and the third data line, wherein the first pixel, the second pixel, and the third pixel may be continuously arranged along the first direction between the driving voltage line and the first data line, and at least one of the first pixel, the second pixel, and the third pixel may include the driving transistor and the switching transistor.

A display device according to an exemplary embodiment includes: a substrate; a driving voltage line and a data line on the substrate; a semiconductor layer including a first electrode of a driving transistor, a channel of the driving transistor, and a second electrode of the driving transistor, the driving transistor being connected to the driving voltage line; a gate electrode of the driving transistor overlapping the channel of the driving transistor; a lower storage electrode extending from the gate electrode of the driving transistor; and an upper storage electrode overlapping the lower storage electrode, wherein the semiconductor layer further includes a first electrode of a switching transistor, a channel of the switching transistor, and a second electrode of the switching transistor, the switching transistor being connected between the lower storage electrode and the data line, the upper storage electrode does not overlap the channel of the driving transistor, the lower storage electrode comprises a third portion and a fourth portion that are connected to the switching transistor, and the upper storage electrode overlaps the third portion of the lower storage electrode and the fourth portion of the lower storage electrode.

The lower storage electrode may further include a first portion and a second portion at opposite sides of the gate electrode of the driving transistor, and the upper storage electrode may overlap the first portion of the lower storage electrode and the second portion of the lower storage electrode.

According to an exemplary embodiment, even though a mask misalignment occurs, the capacitance of the capacitor can be kept constant or substantially constant at a suitable value.

DETAILED DESCRIPTION

Figure 1:
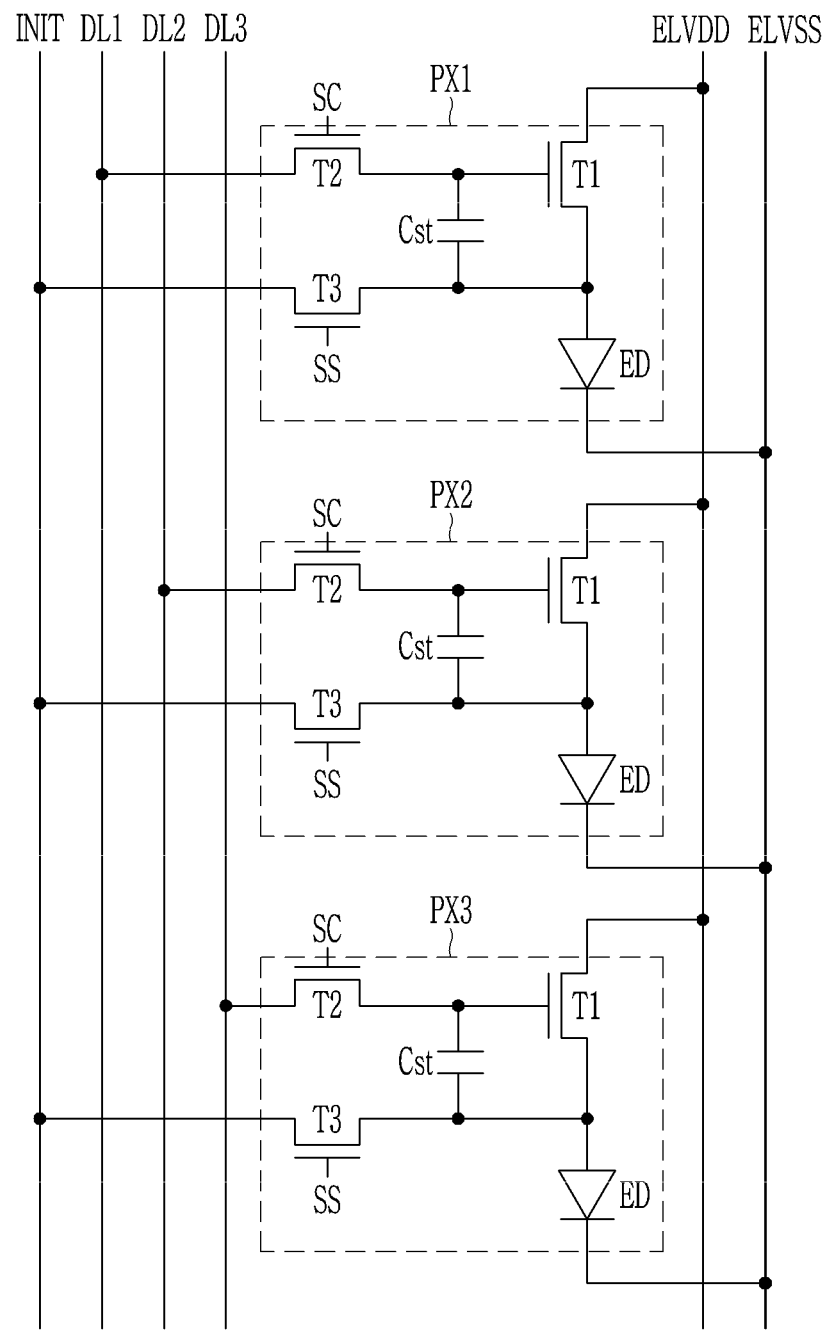
FIG. 1 is a circuit diagram of a display device according to one or more exemplary embodiments.

Hereinafter, the present disclosure will be described more fully with reference to the accompanying drawings, in which exemplary embodiments of the disclosure are shown. As those skilled in the art would appreciate, the described embodiments may be modified in various different ways, all without departing from the spirit or scope of the present disclosure.

The drawings and description are to be regarded as illustrative in nature and are not intended to limit the exemplary embodiments described herein. Like reference numerals designate like elements throughout the specification.

In addition, because the size and thickness of each component shown in the drawings are arbitrarily shown for better understanding and ease of description, the present disclosure is not necessarily limited to what is shown. In the drawings, the thicknesses of layers, films, panels, regions, etc., are exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element, and will not necessarily be understood to be positioned "at an upper side" based on a gravity opposite direction.

It will be understood that when an element is referred to as being "connected to" another element, it may be directly connected the other element or one or more intervening elements may also be present. When an element is referred to as being "directly connected to" another element, there are no intervening elements present.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list As used herein, the term "and/or" includes any and all combinations of one or more of the associated listed items.

Further, the use of "may" when describing embodiments of the present disclosure refers to "one or more exemplary embodiments of the present disclosure".

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Further, throughout the specification, the phrase "on a plane" may refer to viewing a target portion from the top, and the phrase "on a cross-section" refers to a viewing a cross-section formed on a plane cutting through a target object.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Referring to FIG. 1, a display device according to one or more exemplary embodiments will now be described.

FIG. 1 is a circuit diagram of a display device according to one or more exemplary embodiments. A display device according to an exemplary embodiment includes a plurality of pixels. FIG. 1 illustrates three adjacent pixels among the plurality of pixels.

As shown in FIG. 1, the plurality of pixels may include a first pixel PX1, a second pixel PX2, and a third pixel PX3. Each of the first pixel PX1, the second pixel PX2, and the third pixel PX3 may include a plurality of transistors T1, T2, and T3, at least one capacitor Cst, and at least one light emitting diode ED, which is a light emitting element.

The plurality of transistors T1, T2, and T3 may include a driving transistor T1, a switching transistor T2, and an initialization transistor T3. A first electrode and a second electrode may be a source electrode and a drain electrode, respectively, or a drain electrode and a source electrode, respectively, and may be used to distinguish two electrodes positioned at respective sides of channels of each transistor T1, T2, and T3.

A gate electrode of the driving transistor T1 is connected to one end of the capacitor Cst, a first electrode of the driving transistor T1 is connected to a driving voltage line that transmits a driving voltage ELVDD, and a second electrode of the driving transistor T1 is connected to an anode of the light emitting diode ED and the other end of the capacitor Cst. The driving transistor T1 receives data voltages D1, D2, and D2 according to a switching operation of the switching transistor T2, and may supply a driving current to the light emitting diode ED according to a voltage (i.e., electrical charge) stored in the capacitor Cst.

A gate electrode of the switching transistor T2 is connected to a first scan line that transmits a first scan signal SC, a first electrode of the switching transistor T2 is connected to a data line that can transmit the data voltages D1, D2, and D3 or a reference voltage, and a second electrode of the switching transistor T2 is connected to one end of the capacitor Cst and the gate electrode of the driving transistor T1. A plurality of data lines transmit different data voltages D1, D2, and D3. The switching transistor T2 of each of the pixels PX1, PX2, and PX3 is connected to a different data line. The switching transistor T2 is turned on according to the first scan signal SC and may transmit the reference voltage or the data voltages D1, D2, and D3 to the gate electrode of the driving transistor T1 or one end of the capacitor Cst.

A gate electrode of the initialization transistor T3 is connected to a second scan line that transmits a second scan signal SS, a first electrode of the initialization transistor T3 is connected to the other end of the capacitor Cst, the second electrode of the driving transistor T1, and the anode of the light emitting diode ED, and a second electrode of the initialization transistor T3 is connected to an initialization voltage line that transmits an initialization voltage INIT. The initialization transistor T3 is turned on according to the second scan signal SS, and may initialize a voltage of the anode of the light emitting diode ED by transmitting the initialization voltage INIT to the anode of the light emitting diode ED and the other end of the capacitor Cst.

One end of the capacitor Cst is connected to the gate electrode of the driving transistor T1, and the other end is connected to the first electrode of the initialization transistor T3 and the anode of the light emitting diode ED. A cathode of the light emitting diode ED is connected to a common voltage line that transmits a common voltage ELVSS.

The light emitting diode ED may emit light having luminance according to a driving current generated by the driving transistor T1.

An example of operation of the circuit shown in FIG. 1, particularly, an example of operation during one frame period, will now be described. Here, the transistors T1, T2, and T3 are illustrated as N-type channel transistors, but the present disclosure is not limited thereto. For example, in other embodiments, one or more of the transistors T1, T2, and T3 may be P-type channel transistors with suitable changes to the circuit and applied signals as those with ordinary skill in the art would appreciate.

When one frame starts, a first scan signal SC of a high level and a second scan signal SS of a high level are supplied during an initialization period, and thus the switching transistor T2 and the initialization transistor T3 are turned on. The reference voltage is supplied to the gate electrode of the driving transistor T1 and one end of the capacitor Cst from the data line through the turned-on switching transistor T2, and the initialization voltage INIT is supplied to the second electrode of the driving transistor T1 and the anode of the light emitting diode ED through the turned-on initialization transistor T3. Accordingly, the second electrode of the driving transistor T1 and the anode of the light emitting diode ED are initialized with the initialization voltage INIT during an initialization period. In this case, a voltage difference between the reference voltage and the initialization voltage INIT is stored in the capacitor Cst. Here, a voltage difference may refer to an electrical charge corresponding to the voltage difference between the reference voltage and the initialization voltage INIT.

Next, when the second scan signal SS becomes low level while the first scan signal SC of a high level is maintained in a sensing period, the switching transistor T2 maintains the turned-on state and the initialization transistor T3 is turned off. The gate electrode of the driving transistor T1 and one end of the capacitor Cst maintain the reference voltage through the turned-on switching transistor T2, and the second electrode of the driving transistor T1 and the anode of the light emitting diode ED are disconnected from the initialization voltage INIT through the turned-off initialization transistor T3. Accordingly, when a voltage of the second electrode becomes "reference voltage-Vth" while a current flows to the second electrode from the first electrode of the driving transistor T1, the driving transistor T1 is turned off. Vth indicates a threshold voltage of the driving transistor T1. In this case, a voltage difference between the gate electrode and the second electrode of the driving transistor T1 is stored in the capacitor Cst, and sensing of the threshold voltage Vth of the driving transistor T1 is completed. A characteristic deviation of the driving transistor T1, which may be different for each pixel, can be externally compensated by generating a compensated data signal by reflecting the characteristic information sensed during the sensing period.

Next, when the first scan signal SC of a high level is supplied and the second scan signal SS of a low level is supplied during a data input period, the switching transistor T2 is turned on and the initialization transistor T3 is turned off. Data voltages D1, D2, and D3 are supplied to the gate electrode of the driving transistor T1 and one end of the capacitor Cst through each of the pixels PX1, PX2, and PX3 from the turned-on switching transistor T2. In this case, the second electrode of the driving transistor T1 and the anode of the light emitting diode ED can almost maintain the potential in the sensing period by the driving transistor T1, which is in the turned-off state.

Next, the driving transistor T1 that is turned on by the data voltages D1, D2, and D3 transmitted to the gate electrode generates a driving current according to the data voltages D1, D2, and D3, and the light emitting diode ED emits light by (or based on) the driving current in (or during) a light emission period.

Hereinafter, a detailed structure of the display device according to one or more exemplary embodiments will be described with reference to FIGS. 2-7, together with FIG. 1.

Figure 2:
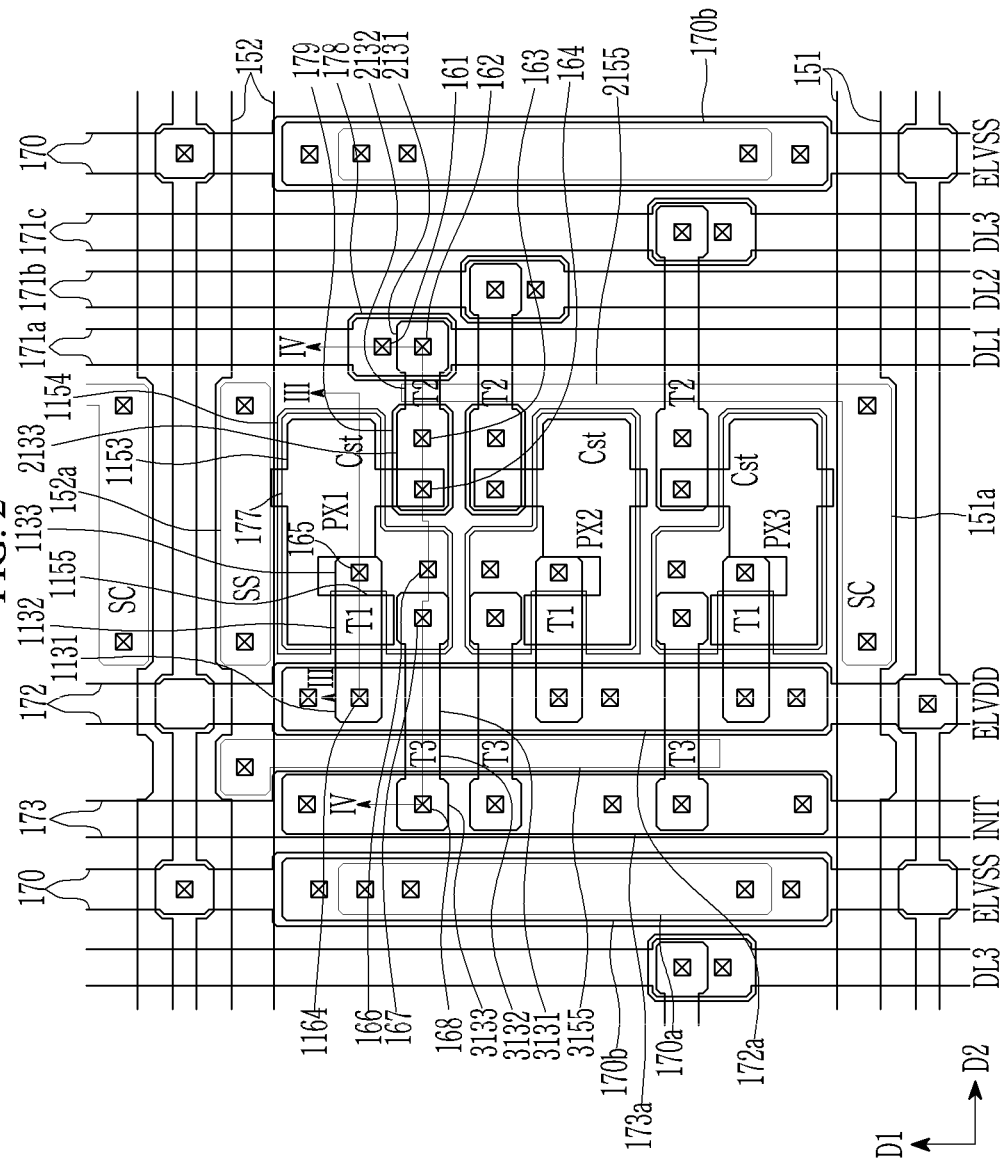
FIG. 2 is a top plan view of a part of the display device according to one or more exemplary embodiments.
Figure 3:
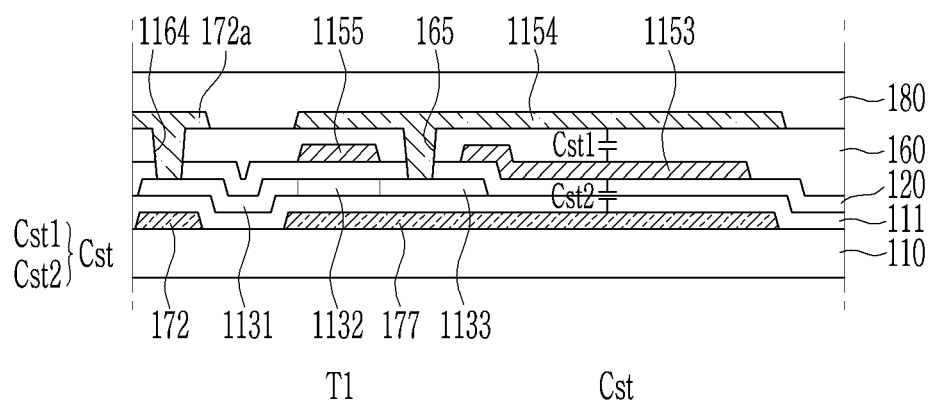
FIG. 3 is a cross-sectional view of the display device of FIG. 2, taken along the line III-III.
Figure 4:
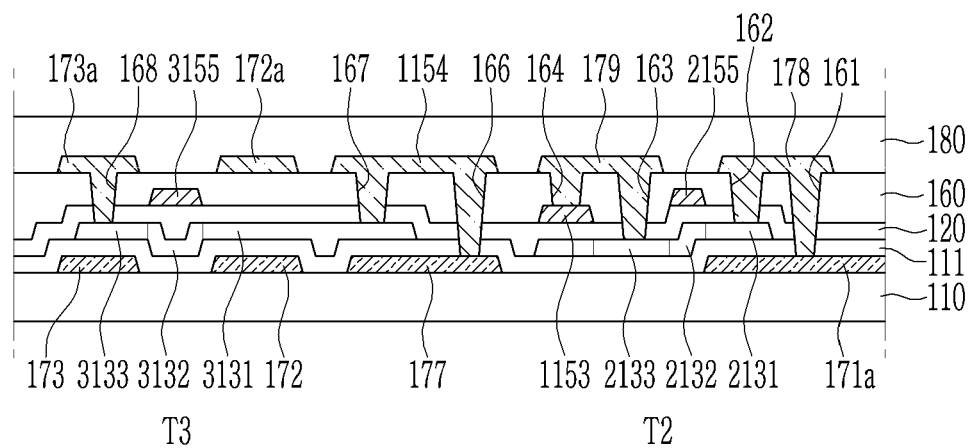
FIG. 4 is a cross-sectional view of the display device of FIG. 2, taken along the line IV-IV.
Figure 5:
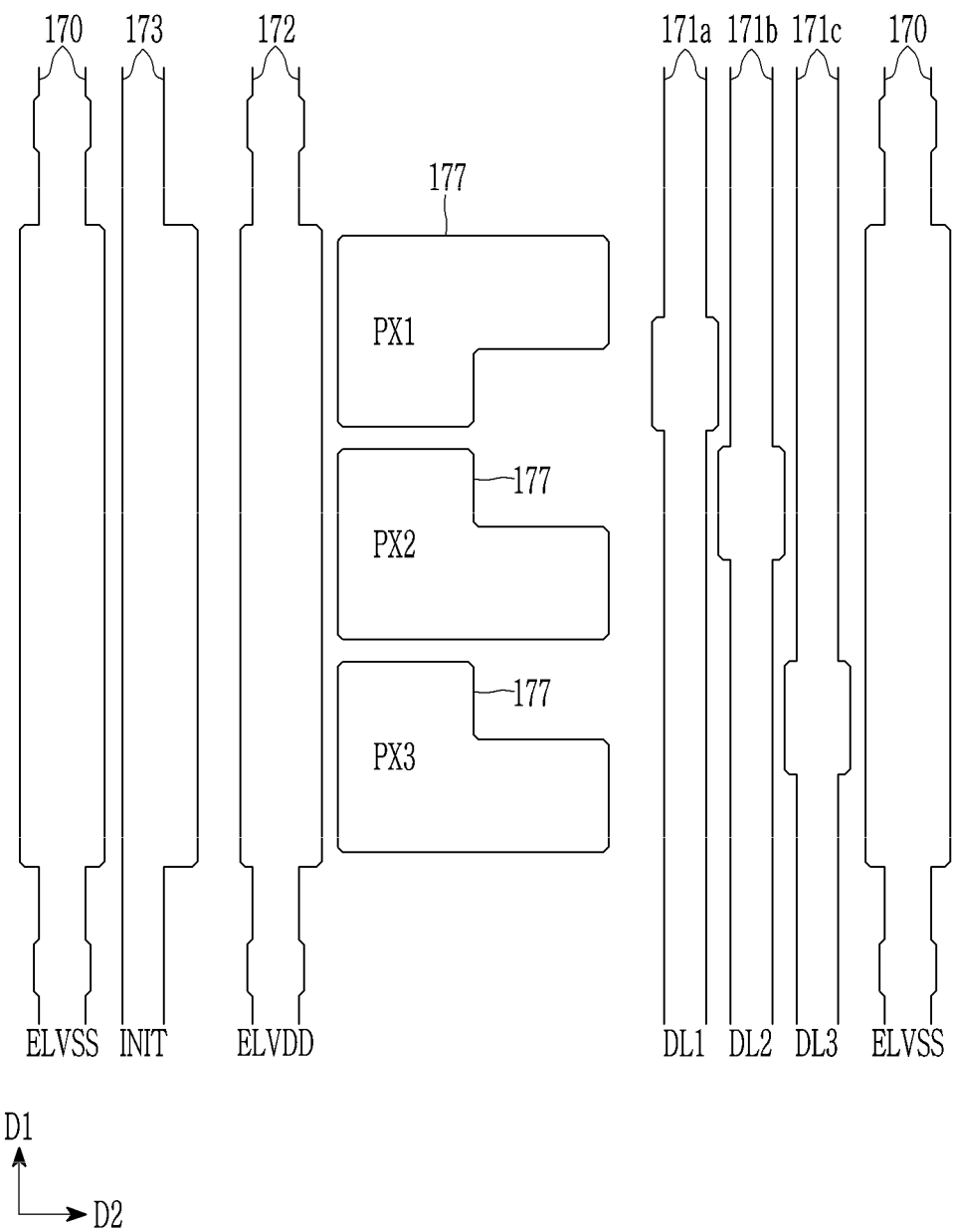
FIGS. 5-7 are top plan views that sequentially illustrate a manufacturing process of the display device according to one or more exemplary embodiments.
Figure 6:
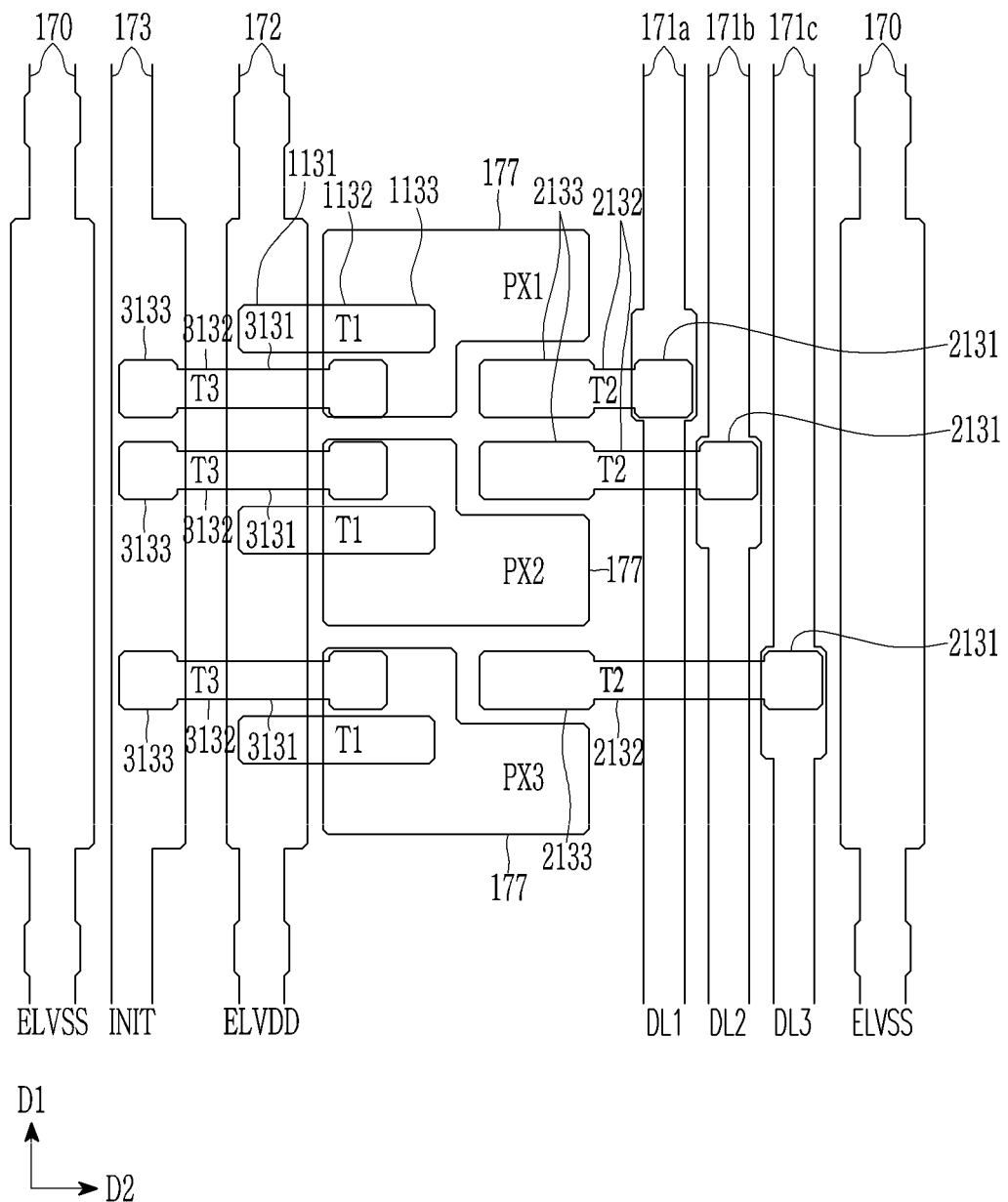
Figure 7:
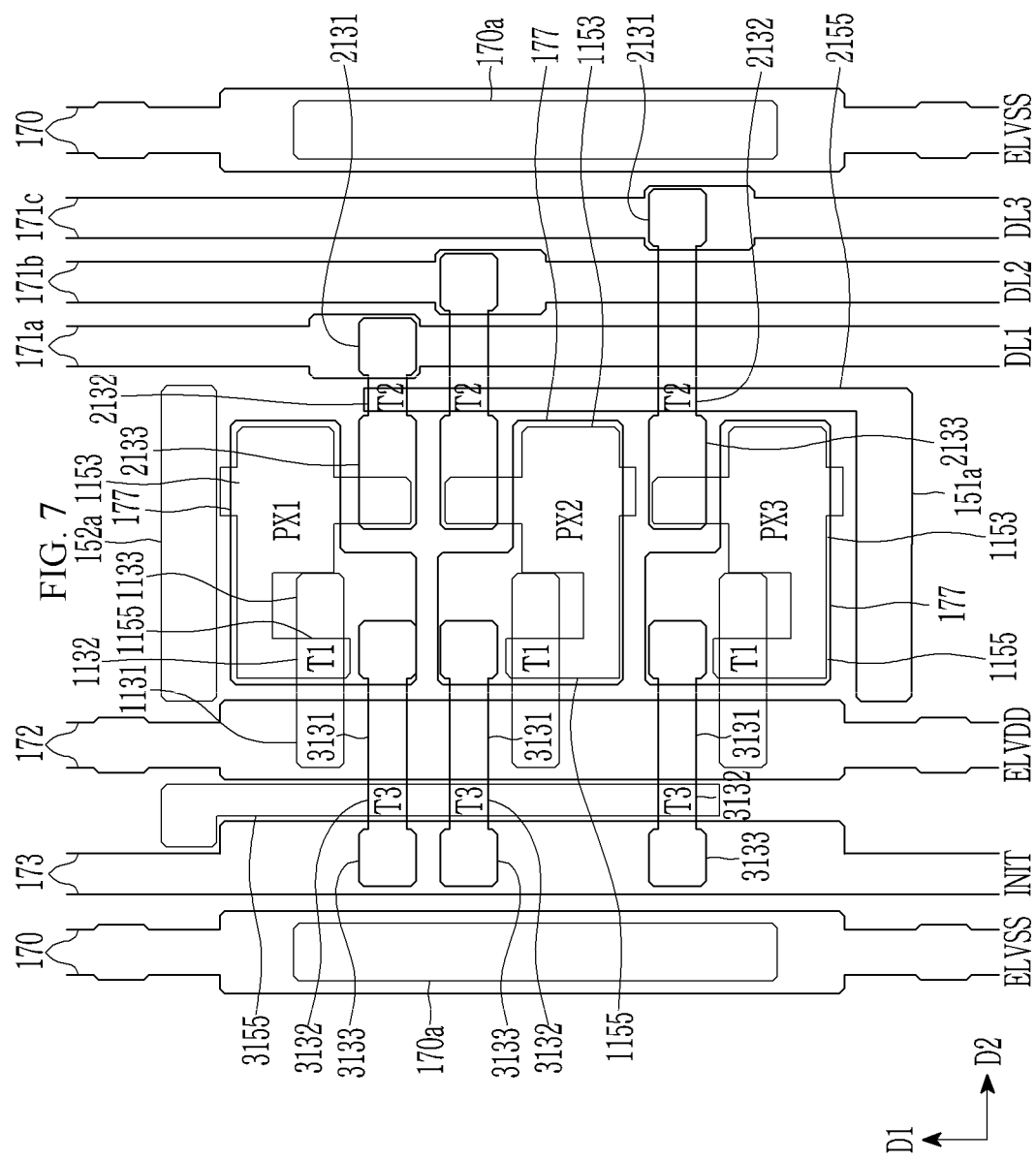

FIG. 2 is a top plan view of a part of the display device according to one or more exemplary embodiments, FIG. 3 is a cross-sectional view of the display device of FIG. 2, taken along the line III-Ill, and FIG. 4 is a cross-sectional view of the display device of FIG. 2, taken along the line IV-IV. FIGS. 5-7 are top plan views that sequentially illustrate a manufacturing process of the display device according to one or more exemplary embodiments. FIGS. 2-7 illustrate three adjacent pixels of the display device according to one or more exemplary embodiments, and the pixels may be iteratively arranged.

Here, each of the plurality of pixels PX1, PX2, and PX3 may imply constituent elements included in one pixel. In other words, reference to one of the plurality of pixels PX1, PX2, and PX3 may imply a portion or an area where the plurality of transistors T1, T2, and T3, the capacitor Cst, and the light emitting diode are formed.

The display device according to the exemplary embodiment may include a substrate 110. The substrate 110 may include an insulation material such as glass, plastic, and/or the like, and may have flexibility.

A first conductive layer that includes first data lines 171a, second data lines 171b, and third data lines 171c may be disposed on the substrate 110. FIG. 5 illustrates the first conductive layer.

The first data line 171a, the second data line 171b, and the third data line 171c extend in a first direction D1. That is, the first data line 171a, the second data line 171b, and the third data line 171c may have a set width (e.g., predetermined width) and may be formed in a shape of a rod extending along the first direction D1. The first data line 171a, the second data line 171b, and the third data line 171c may be disposed to be adjacent to each other along the second direction D2 crossing the first direction D1. The first data line 171a, the second data line 171b, and the third data line 171c may be positioned so as to be spaced from each other (e.g., spaced from each other in the second direction D2) by a set interval (e.g., predetermined interval). Different data voltages DL1, DL2, and DL3 are applied to the first data line 171a, the second data line 171b, and the third data line 171c, and the first data line 171a, the second data line 171b, and the third data line 171c may be spaced from each other to thereby prevent or substantially prevent an occurrence of a short circuit therebetween. The first direction D1 may be a column direction, and the second direction D2 may be a row direction. The first direction D1 and the second direction D2 may cross each other, and may be perpendicular to each other. The second data line 171b may be disposed adjacent to the right side of the first data line 171a, and the third data line 171c may be disposed adjacent to the right side of the second data line 171b. In one or more exemplary embodiments, the second data line 171b may be between the first data line 171a and the third data line 171c in the second direction D2. In this particular case, the expression that data lines 171a, 171b, and 171c are adjacent (e.g., directly adjacent) to each other may refer to other wires extending in a direction parallel to the data lines 171a, 171b, and 171c not being positioned between the data lines 171a, 171b, and 171c. That is, other wires extending in the direction parallel to the first data line 171a and the second data line 171b are not disposed between the first data line 171a and the second data line 171b that are adjacent (e.g., directly adjacent) to each other. In addition, other wires extending in the direction parallel to the second data line 171b and the third data line 171c are not disposed between the second data line 171b and the third data line 171c that are adjacent (e.g., directly adjacent) to each other.

The first conductive layer may further include a common voltage line 170, an initialization voltage line 173, a driving voltage line 172, and a light blocking pattern 177.

The common voltage line 170, the initialization voltage line 173, and the driving voltage line 172 extend in the first direction D1. That is, the common voltage line 170, the initialization voltage line 173, and the driving voltage line 172 may extend in a direction parallel to the first to third data lines (the first data line 171a, the second data line 171b, and the third data line 171c). The common voltage line 170, the initialization voltage line 173, and the driving voltage line 172 may be disposed to be adjacent to each other along the second direction D2. The common voltage line 170, the initialization voltage line 173, and the driving voltage line 172 may be disposed to be spaced from each other (e.g., spaced from each other in the second direction D2) by a set interval (e.g., predetermined interval). The common voltage ELVSS may be applied to the common voltage line 170, the initialization voltage INIT may be applied to the initialization voltage line 173, and a driving voltage ELVDD may be applied to the driving voltage line 172. The common voltage line 170, the initialization voltage line 173, and the driving voltage line 172 applied with different data voltages DL1, DL2, and DL3 may be spaced from each other to thereby prevent or substantially prevent an occurrence of a short circuit therebetween. Although the initialization voltage line 173 may be disposed between the driving voltage line 172 and the initialization voltage line 173, the positions of the initialization voltage line 173, the driving voltage line 172, and the initialization voltage line 173 are not limited thereto and may be changed.

The light blocking pattern 177 may be disposed between the driving voltage line 172 and the first data line 171a on a plane (e.g., a plane formed by the first direction D1 and the second direction D2) or in a plan view. In one or more exemplary embodiments, a plurality of light blocking patterns 177 may be disposed to be adjacent to each other along the first direction D1, and each of the first to third pixels (the first pixel PX1, the second pixel PX2, and the third pixel PX3) includes a light blocking pattern 177 of the plurality of light blocking patterns 177. On a plane or in a plan view, the light blocking pattern 177 of the second pixel PX2 may be disposed below the light blocking pattern 177 of the first pixel PX1, and the light blocking pattern 177 of the third pixel PX3 may be disposed below the light blocking pattern 177 of the second pixel PX2. In one or more exemplary embodiments, the light blocking pattern 177 of the second pixel PX2 may be between the light blocking pattern 177 of the first pixel PX1 and the light blocking pattern 177 of the third pixel PX3 on a plane or in a plan view.

The planar shape of the light blocking pattern 177 may have a polygonal shape. The planar shape of the light blocking pattern 177 of each of the plurality of pixels PX1, PX2, and PX3 may have the same shape or different shapes from each other. In one or more exemplary embodiments, the planar shapes of the light blocking patterns 177 of the first pixel PX1 and the second pixel PX2 may be symmetrical to each other, and the planar shapes of the light blocking patterns 177 of the second pixel PX2 and the third pixel PX3 may be the same. For example, the planar shapes of the light blocking patterns 177 of the first pixel PX1 and the second pixel PX2 may be oriented to be symmetrical to each other with respect to an imaginary line extending in the second direction D2 between the light blocking patterns 177 of the first pixel PX1 and the second pixel PX2, and the planar shapes of the light blocking patterns 177 of the second pixel PX2 and the third pixel PX3 may be oriented in the same or substantially the same manner.

A buffer layer 111, which is an insulation layer, may be disposed on the first conductive layer that includes the first data line 171a, the second data line 171b, the third data line 171c, the common voltage line 170, the initialization voltage line 173, the driving voltage line 172, and the light blocking pattern 177.

A semiconductor layer that includes channels 1132, first electrodes 1131, and second electrodes 1133 of the driving transistors T1, channels 2132, first electrodes 2131, and second electrodes 2133 of the switching transistors T2, and channels 3132, first electrodes 3131, and second electrodes 3133 of the initialization transistors T3 of the first to third pixels PX1, PX2, and PX3 may be disposed on the buffer layer 111. FIG. 6 illustrates the first conductive layer and the semiconductor layer. The semiconductor layer may include a semiconductor material such as amorphous silicon, polysilicon, or an oxide semiconductor.

The channel 1132, the first electrode 1131, and the second electrode 1133 of the driving transistor T1 may each be formed in the shape of a rod extending in the second direction D2. The channel 1132 of the driving transistor T1 may be disposed between the first electrode 1131 and the second electrode 1133. The first electrode 1131 of the driving transistor T1 may overlap the driving voltage line 172. The first electrode 1131 of the driving transistor T1 may be connected to the driving voltage line 172, and may receive the driving voltage ELVDD from the driving voltage line 172. However, the first electrode 1131 of the driving transistor T1 may not be directly connected to the driving voltage line 172. The channel 1132 and the second electrode 1133 of the driving transistor T1 may overlap the light blocking pattern 177.

The driving transistors T1 of the first to third pixels PX1, PX2, and PX3 may be sequentially disposed along the first direction D1. That is, the driving transistor T1 of the second pixel PX2 may be disposed below the driving transistor T1 of the first pixel PX1, and the driving transistor T1 of the third pixel PX3 may be disposed below the driving transistor T1 of the second pixel PX2 on a plane or in a plan view. In one or more exemplary embodiments, the driving transistor T1 of the second pixel PX2 may be between the driving transistor T1 of the first pixel PX1 and the driving transistor T1 of the third pixel PX3 on a plane or in a plan view.

The channel 2132, the first electrode 2131, and the second electrode 2133 of the switching transistor T2 may be formed in the shape of a rod extending in the second direction D2. The channel 2132 of the switching transistor T2 may be disposed between the first electrode 2131 and the second electrode 2133. The first electrodes 2131 of the switching transistor T2 may overlap the data lines 171*a*, 171*b*, and 171*c*, and may be connected with the data lines 171*a*, 171*b*, and 171*c*. The first electrode 2131 of the switching transistor T2 of the first pixel PX1 may be connected to the first data line 171*a*. The first electrode 2131 of the switching transistor T2 of the second pixel PX2 may be connected to the second data line 171*b*. The first electrode 2131 of the switching transistor T2 of the third pixel PX3 may be connected to the third data line 171*c*. However, the first electrode 2131 of the switching transistor T2 of each of the first to third pixels PX1, PX2, and PX3 may not be directly connected to each of the data lines 171*a*, 171*b*, and 171*c*. The first electrodes 2131 of the switching transistors T2 of the first to third pixels PX1, PX2, and PX3 may have different lengths. For example, the length of the first electrode 2131 of the switching transistor T2 of the first pixel PX1 may be shorter than the length of the first electrode 2131 of the switching transistor T2 of the second pixel PX2. In addition, the length of the first electrode 2131 of the switching transistor T2 of the second pixel PX2 may be shorter than the first electrode 2131 of the switching transistor T2 of the third pixel PX3.

The switching transistors T2 of the first to third pixels PX1, PX2, and PX3 may be sequentially positioned along the first direction D1. That is, the switching transistor T2 of the second pixel PX2 may be disposed below the switching transistor T2 of the first pixel PX1, and the switching transistor T2 of the third pixel PX3 may be disposed below the switching transistor T2 of the second pixel PX2 on a plane or in a plan view. In one or more exemplary embodiments, the switching transistor T2 of the second pixel PX2 may be between the switching transistor T2 of the first pixel PX1 and the switching transistor T2 of the third pixel PX3 on a plane or in a plan view. The switching transistors T2 of the first to third pixels PX1, PX2, and PX3 are connected to different data lines of the data lines 171*a*, 171*b*, and 171*c*.

Channels 3132, first electrodes 3131, and second electrodes 3133 of the first electrode initialization transistors T3 may be formed in the shape of a rod extending in the second direction D2. The channel 3132 of the initialization transistor T3 may be disposed between the first electrode 3131 and the second electrode 3133. The second electrode 3133 of the initialization transistor T3 may overlap the initialization voltage line 173. The second electrode 3133 of the initialization transistor T3 may be connected to the initialization voltage line 173, and may receive the initialization voltage INIT. However, the second electrode 3133 of the initialization transistor T3 may not be directly connected to the initialization voltage line 173. The first electrode 3131 of the initialization transistor T3 may overlap the driving voltage line 172 and the light blocking pattern 177.

The initialization transistors T3 of the first to third pixels PX1, PX2, and PX3 may be sequentially positioned along the first direction D1. That is, the initialization transistor T3 of the second pixel PX2 may be disposed below the initialization transistor T3 of the first pixel PX1, and the initialization transistor T3 of the third pixel PX3 may be disposed below the initialization transistor T3 of the second pixel PX2 on a plane or in a plan view. In one or more exemplary embodiments, the initialization transistor T3 of the second pixel PX2 may be between the initialization transistor T3 of the first pixel PX1 and the initialization transistor T3 of the third pixel PX3 on a plane or in a plan view.

A first insulation layer 120 may be disposed on the semiconductor layer that includes the channels 1132, the first electrodes 1131, and the second electrodes 1133 of the driving transistors T1, the channels 2132, the first electrodes 2131, and the second electrodes 2133 of the switching transistors T2, and the channels 3132, the first electrodes 3131, and the second electrodes 3133 of the initialization transistors T3.

A second conductive layer that includes gate electrodes 1155 of the driving transistors T1, gate electrodes 2155 of the switching transistors T2, and gate electrodes 3155 of the initialization transistors T3, and lower storage electrodes 1153 of the first to third pixels PX1, PX2, and PX3, may be disposed on the first insulation layer 120. FIG. 7 illustrates the first conductive layer, the semiconductor layer, and the second conductive layer.

The gate electrode 1155 of the driving transistor T1 may overlap the channel 1132 of the driving transistor T1. The gate electrode 1155 of the driving transistor T1 may be connected to the lower storage electrode 1153, or may be formed (e.g., integrally formed) with the lower storage electrode 1153. The lower storage electrode 1153 extends from the gate electrode 1155 of the driving transistor T1. The lower storage electrode 1153 and the gate electrode 1155 of the driving transistor T1 may overlap the light blocking pattern 177. The lower storage electrode 1153 may overlap the second electrode 2133 of the switching transistor T2. The lower storage electrode 1153 may be connected to the second electrode 2133 of the switching transistor T2. However, the lower storage electrode 1153 may not be directly connected to the second electrode 2133 of the switching transistor T2.

A planar shape of the lower storage electrode 1153 may have a polygonal shape. Planar shapes of the lower storage electrodes 1153 of the first to third pixels PX1, PX2, and PX3 may have the same shape or different shapes from each other. For example, the planar shape of the lower storage electrode 1153 of the first pixel PX1 and the planar shape of the lower storage electrode 1153 of the second pixel PX2 may be symmetrical to each other, and the planar shape of the lower storage electrode 1153 of the second pixel PX2 and the planar shape of the lower storage electrode 1153 of the third pixel PX3 may be the same as each other. For example, the planar shapes of the lower storage electrode 1153 of the first pixel PX1 and the second pixel PX2 may be oriented to be symmetrical to each other with respect to an imaginary line extending in the second direction D2 between the lower storage electrodes 1153 of the first pixel PX1 and the second pixel PX2, and the planar shapes of the lower storage electrodes 1153 of the second pixel PX2 and the third pixel PX3 may be oriented in the same or substantially the same manner.

The gate electrode 2155 of the switching transistor T2 may overlap the channel 2132 of the switching transistor T2. The gate electrodes 2155 of the switching transistors T2 of the first to third pixels PX1, PX2, and PX3 may be connected to each other, or may be formed (e.g., integrally formed) with each other. Thus, the gate electrodes 2155 of the switching transistors T2 of the first to third pixels PX1, PX2, and PX3 may be applied with the same first scan signal SC. In this case, the gate electrodes 2155 of the switching transistors T2, which are connected to each other, may be formed in the shape of a rod extending in the first direction D1.

The gate electrodes 3155 of the initialization transistors T3 may overlap the channels 3132 of the initialization transistors T3. The gate electrodes 3155 of the initialization transistors T3 of the first to third pixels PX1, PX2, and PX3 may be connected to each other, and may be formed (e.g., integrally formed) with each other. Thus, the gate electrodes 3155 of the initialization transistors T3 of the first to third pixels PX1, PX2, and PX3 may be applied with the same second scan signal SS. In this case, the gate electrodes 3155 of the initialization transistors T3, which are connected to each other, may be formed in the shape of a rod extending in the first direction D1.

The switching transistor T2 and the initialization transistor T3 may be disposed adjacent to each other along the second direction D2.

After forming the second conductive layer, a doping process may be carried out. A portion of the semiconductor layer covered by the second conductive layer is not doped, and a portion of the semiconductor layer not covered by the second conductive layer is doped, and thus may have characteristics of a conductor (e.g., have an increased conductivity). That is, the channel 1132 of the driving transistor T1, the channel 2132 of the switching transistor T2, and the channel 3132 of the initialization transistor T3, which are covered by the second conductive layer, are not doped. The first electrode 1131 and the second electrode 1133 of the driving transistor T1, the first electrode 2131 and the second electrode 2133 of the switching transistor T2, and the first electrode 3131 and the second electrode 3133 of the initialization transistor T3, which are not covered by the second conductive layer, are doped, and thus have the characteristics of a conductor (e.g., have an increased conductivity).

The second conductive layer may further include a first auxiliary scan pattern 151a, a second auxiliary scan pattern 152a, and a first common voltage auxiliary pattern 170a.

The first auxiliary scan pattern 151a and the second auxiliary scan pattern 152a may extend in the second direction D2. The lower storage electrodes 1153 of the first to third pixels PX1, PX2, and PX3 may be disposed between the first auxiliary scan pattern 151a and the second auxiliary scan pattern 152a on a plane or in a plan view. The first auxiliary scan pattern 151a may be connected to the gate electrode 2155 of the switching transistor T2, or may be formed (e.g., integrally formed) with the gate electrode 2155 of the switching transistor T2.

The first common voltage auxiliary pattern 170a may overlap the common voltage line 170. The first common voltage auxiliary pattern 170a may be formed in the shape of a rod extending in the first direction D1. The common voltage line 170 may have a shape that extends from one end of the substrate 110 to the other end of the substrate 110 on a plane or in a plan view. For example, the common voltage line 170 may have a shape that extends from the lower end of the substrate 110 to the top end of the substrate 110 on a plane or in a plan view. The first common voltage auxiliary pattern 170a may be repeatedly disposed with a disconnected shape for each of the three pixels PX1, PX2, and PX3. The first common voltage auxiliary pattern 170a may be connected to the common voltage line 170, and may serve to reduce resistance of the common voltage line 170. In this case, the first common voltage auxiliary pattern 170a may not be directly connected with the common voltage line 170.

The second insulation layer 160 may be disposed on the second conductive layer that includes the gate electrode 1155 of the driving transistor T1, the gate electrode 2155 of the switching transistor T2, the gate electrode 3155 of the initialization transistor T3, and the lower storage electrode 1153.

A third conductive layer that includes a first scan line 151, a second scan line 152, and an upper storage electrode 1154 may be disposed on the second insulation layer 160. FIG. 2 illustrates the first conductive layer, the semiconductor layer, the second conductive layer, and the third conductive layer.

The first scan line 151 extends in the second direction D2. The first scan line 151 may cross the data lines 171a, 171b, and 171c, and the first scan line 151 and the data lines 171a, 171b, and 171c may overlap each other at portions where the first scan line 151 and the data lines 171a, 171b, and 171c cross each other. The first scan line 151 may overlap the first auxiliary scan pattern 151a. The first scan line 151 may connected to the first auxiliary scan pattern 151a.

The first auxiliary scan pattern 151a may serve to reduce resistance of the first scan line 151. The first auxiliary scan pattern 151a may not overlap the data lines 171a, 171b, and 171c. The first scan line 151 may have a shape that extends from one end of the substrate 110 to the other end of the substrate 110 on a plane or in a plan view. For example, the first scan line 151 may have a shape that extends from the left end of the substrate 110 to the right end of the substrate 110 on a plane or in a plan view. The first auxiliary scan pattern 151a may be repeatedly disposed with a disconnected shape that has a length corresponding to a region between the driving voltage line 172 and the first data line 171a. In one or more exemplary embodiments, the first auxiliary scan pattern 151a may be between the driving voltage line 172 and the first data line 171a on a plane or in a plan view. The first scan line 151 may be applied with the first scan signal SC. The first scan line 151 may be connected with the gate electrode 2155 of the switching transistor T2 through the first auxiliary scan pattern 151a. Thus, the gate electrode 2155 of the switching transistor T2 may receive the first scan signal SC from the first scan line 151.

The second scan line 152 extends in the second direction D2. The second scan line 152 may cross the data lines 171a, 171b, and 171c, and the second scan line 152 and the data lines 171a, 171b, and 171c may overlap at a portion where the second scan line 152 and the data lines 171a, 171b, and 171c cross each other. The second scan line 152 may overlap the second auxiliary scan pattern 152a. The second scan line 152 may be connected with the second auxiliary scan pattern 152a. The second auxiliary scan pattern 152a may serve to reduce resistance of the second scan line 152. The second auxiliary scan pattern 152a may not overlap the data lines 171a, 171b, and 171c. The second scan line 152 may have a shape that extends from one end of the substrate 110 to the other end of the substrate 110 on a plane or in a plan view. For example, the second scan line 152 may have a shape that extends from the left end of the substrate 110 to the right end of the substrate 110 on a plane or in a plan view. The second auxiliary scan pattern 152a may be repeatedly disposed with a disconnected shape that has a length corresponding to a region between the driving voltage line 172 and the first data line 171a. In one or more exemplary embodiments, the second auxiliary scan pattern 152a may be between the driving voltage line 172 and the first data line 171a on a plane or in a plan view. The second scan line 152 may be applied with the second scan signal SS. The second scan line 152 may be connected with the gate electrode 3155 of the initialization transistor T3. Thus, the gate electrode 3155 of the initialization transistor T3 may receive the second scan signal SS from the second scan line 152.

The upper storage electrode 1154 may overlap the lower storage electrode 1153. The lower storage electrode 1153 and the upper storage electrode 1154 may form a first capacitor Cst1 by overlapping each other with the second insulation layer 160 disposed therebetween. The lower storage electrode 1153 may overlap the light blocking pattern 177 with the first insulation layer 120 disposed therebetween, and may form a second capacitor Cst2. Therefore, the lower storage electrode 1153 may be an electrode of both the first capacitor Cst1 and the second capacitor Cst2. That is, the capacitor Cst may be formed doubly by including the first capacitor Cst1 and the second capacitor Cst2.

The upper storage electrode 1154 may overlap the second electrode 1133 of the driving transistor T1. The second insulation layer 160 may include an opening 165 that overlaps the upper storage electrode 1154 and the second electrode 1133 of the driving transistor T1. The opening 165 may be further formed on the first insulation layer 120. The upper storage electrode 1154 may be connected to the second electrode 1133 of the driving transistor T1 through the opening 165.

The upper storage electrode 1154 may not overlap the channel 1132 of the driving transistor T1. The channel 1132 of the driving transistor T1 may be formed in the shape of a polygon that includes a first edge, a second edge, a third edge, and a fourth edge on a plane or in a plan view. For example, the channel 1132 of the driving transistor T1 may be formed in the shape of a quadrangle. The first edge and the second edge may be opposite each other. The third edge and the fourth edge may be opposite each other. The third edge may connect the first edge and the second edge. The fourth edge may connect the first edge and the second edge. On a plane or in a plan view, the first edge may be a top edge, the second edge may be a bottom edge, the third edge may be a right edge, and the fourth edge may be a left edge. The upper storage electrode 1154 may have a shape that surrounds the first edge, the second edge, and the third edge of the channel 1132 of the driving transistor T1 on a plane or in a plan view. For example, the upper storage electrode 1154 may be adjacent the first edge, the second edge, and the third edge of the channel 1132 of the driving transistor T1 on a plane or in a plan view. The upper storage electrode 1154 may have a shape that does not surround the fourth edge of the channel 1132 of the driving transistor T1 on a plane or in a plan view. The upper storage electrode 1154 may be disposed at a set distance (e.g., predetermined distance) from the third edge of the channel 1132 of the driving transistor T1 on a plane or in a plan view.

The upper storage electrode 1154 may overlap the light blocking pattern 177. The second insulation layer 160 may include an opening 166 that overlaps the upper storage electrode 1154 and the light blocking pattern 177. The opening 166 may be further formed on the first insulation layer 120 and the buffer layer 111. The upper storage electrode 1154 may be connected to the light blocking pattern 177 through the opening 166.

The upper storage electrode 1154 may overlap the first electrode 3131 of the initialization transistor T3. The second insulation layer 160 may include an opening 167 that overlaps the upper storage electrode 1154 and the first electrode 3131 of the initialization transistor T3. The opening 167 may be further formed in the first insulation layer 120. The upper storage electrode 1154 may be connected to the first electrode 3131 of the initialization transistor T3 through the opening 167.

Each of the first to third pixels PX1, PX2, and PX3 includes the upper storage electrode 1154, the lower storage electrode 1153, and the light blocking pattern 177. The upper storage electrodes 1154, the lower storage electrodes 1153, and the light blocking patterns 177 of the first to third pixels PX1, PX2, and PX3, may be disposed between the first scan line 151 and the second scan line 152 on a plane or in a plan view. In addition, the upper storage electrodes 1154, the lower storage electrodes 1153, and the light blocking patterns 177 of the first to third pixels PX1, PX2, and PX3 may be disposed between the driving voltage line 172 and the first data line 171a on a plane or in a plan view. That is, upper storage electrodes 1154, the lower storage electrodes 1153, and the light blocking patterns 177 of the first to third pixels PX1, PX2, and PX3 are surrounded by the first scan line 151, the second scan line 152, the driving voltage line 172, and the first data line 171a on a plane or in a plan view. The upper storage electrodes 1154 of the first to third pixels PX1, PX2, and PX3 may be disposed to be adjacent to each other along the first direction D1. The upper storage electrode 1154 of the second pixel PX2 may be disposed below the upper storage electrode 1154 of the first pixel PX1, and the upper storage electrode 1154 of the third pixel PX3 may be disposed below the upper storage electrode 1154 of the second pixel PX2 on a plane or in a plan view. In one or more exemplary embodiments, the upper storage electrode 1154 of the second pixel PX2 may be between the upper storage electrode 1154 of the first pixel PX1 and the upper storage electrode 1154 of the third pixel PX3 on a plane or in a plan view. The lower storage electrodes 1153 of the first to third pixels PX1, PX2, and PX3 may be disposed to be adjacent to each other along the first direction D1. On a plane or in a plan view, the lower storage electrode 1153 of the second pixel PX2 may be disposed below the lower storage electrode 1153 of the first pixel PX1, and the lower storage electrode 1153 of the third pixel PX3 may be disposed below the lower storage electrode 1153 of the second pixel PX2. In one or more exemplary embodiments, the lower storage electrode 1153 of the second pixel PX2 may be between the lower storage electrode 1153 of the first pixel PX1 and the lower storage electrode 1153 of the third pixel PX on a plane or in a plan view.

A planar shape of the upper storage electrode 1154 may be a polygonal shape. Planar shapes of the upper storage electrodes 1154 of the first to third pixels PX1, PX2, and PX3 may have the same shape or different shapes from each other. For example, the planar shape of the upper storage electrode 1154 of the first pixel PX1 and the planar shape of the upper storage electrode 1154 of the second pixel PX2 may be symmetrical to each other, and the planar shape of the upper storage electrode 1154 of the second pixel PX2 and the planar shape of the upper storage electrode 1154 of the third pixel PX3 may be the same. For example, the planar shapes of the upper storage electrode 1154 of the first pixel PX1 and the second pixel PX2 may be oriented to be symmetrical to each other with respect to an imaginary line extending in the second direction D2 between the upper storage electrodes 1154 of the first pixel PX1 and the second pixel PX2, and the planar shapes of the upper storage electrodes 1154 of the second pixel PX2 and the third pixel PX3 may be oriented in the same or substantially the same manner.

The third conductive layer may further include a first connection electrode 178, a second connection electrode 179, an initialization voltage auxiliary pattern 173a, a driving voltage auxiliary pattern 172a, and a second common voltage auxiliary pattern 170b.

Each of the pixels PX1, PX2, and PX3 may include the first connection electrode 178. The first connection electrode 178 of each of the pixels PX1, PX2, and PX3 may overlap the respective data lines 171a, 171b, and 171c. The second insulation layer 160 may include an opening 161 that overlaps the first connection electrode 178 and the respective data lines 171a, 171b, and 171c. The opening 161 may be further formed on the first insulation layer 120 and the buffer layer 111. The first connection electrode 178 may be connected with the data lines 171a, 171b, and 171c through the opening 161. The first connection electrodes 178 of the respective pixels PX1, PX2, and PX3 may overlap the first electrodes 2131 of the switching transistors T2. The second insulation layer 160 may include an opening 162 that overlaps the first connection electrode 178 and the first electrode 2131 of the switching transistor T2. The opening 162 may be further formed in the first insulation layer 120. The first connection electrode 178 may be connected with the first electrode 2131 of the switching transistor T2 through the opening 162. Thus, the first connection electrodes 178 may be connected between the respective data lines 171a, 171b, and 171c and the first electrodes 2131 of the switching transistors T2. In the first pixel PX1, the first connection electrode 178 may be connected between the first data line 171a and the first electrode 2131 of the switching transistor T2. In the second pixel PX2, the first connection electrode 178 may be connected between the second data line 171b and the first electrode 2131 of the switching transistor T2. In the third pixel PX3, the first connection electrode 178 may connect the third data line 171c and the first electrode 2131 of the switching transistor T2.

Each of the pixels PX1, PX2, and PX3 may include the second connection electrode 179. The second connection electrode 179 of each of the pixels PX1, PX2, and PX3 may overlap the second electrode 2133 of the second connection electrode 179. The second insulation layer 160 may include an opening 163 that overlaps the second connection electrode 179 and the second electrode 2133 of the switching transistor T2. The opening 163 may be further formed in the first insulation layer 120. The second connection electrode 179 may be connected to the second electrode 2133 of the switching transistor T2 through the opening 163. The second connection electrode 179 of each of the pixels PX1, PX2, and PX3 may overlap the lower storage electrode 1153. The second insulation layer 160 may include an opening 164 that overlaps the second connection electrode 179 and the lower storage electrode 1153. The second connection electrode 179 may be connected to the lower storage electrode 1153 through the opening 164. Thus, in each of the pixels PX1, PX2, and PX3, the second connection electrode 179 may be connected between the second electrode 2133 of the switching transistor T2 and the lower storage electrode 1153.

The first connection electrode 178 and the second connection electrode 179 may be disposed on or at the same layer as the upper storage electrode 1154. The first connection electrode 178 may overlap the first electrode 2131 of the switching transistor T2, and the second connection electrode 179 may overlap the second electrode 2133 of the switching transistor T2. The first connection electrode 178 and the second connection electrode 179 may not overlap (e.g., overlap in the thickness direction of the substrate 110) the channel 2132 of the switching transistor T2.

The initialization voltage auxiliary pattern 173a may overlap the initialization voltage line 173. The initialization voltage auxiliary pattern 173a may be connected with the initialization voltage line 173. The initialization voltage auxiliary pattern 173a may serve to reduce resistance of the initialization voltage line 173. The initialization voltage auxiliary pattern 173a may have a bar shape extending in the first direction D1. The initialization voltage auxiliary pattern 173a may be repeatedly disposed with a disconnected (or broken) shape in each of the three pixels PX1, PX2, and PX3. The initialization voltage auxiliary pattern 173a may overlap the second electrode 3133 of the initialization transistor T3. The second insulation layer 160 may include an opening 168 that overlaps the initialization voltage auxiliary pattern 173a and the second electrode 3133 of the initialization transistor T3. The opening 168 may be further formed in the first insulation layer 120. The initialization voltage auxiliary pattern 173a may be connected to the second electrode 3133 of the initialization transistor T3 through the opening 168. The initialization voltage auxiliary pattern 173a may connect the second electrode 3133 of the initialization transistor T3 and the initialization voltage line 173. Thus, the second electrode 3133 of the initialization transistor T3 may receive the initialization voltage INIT from the initialization voltage line 173.

The initialization voltage auxiliary pattern 173a may be disposed on the same layer as the upper storage electrode 1154. The initialization voltage auxiliary pattern 173a may overlap (e.g., overlap in the thickness direction of the substrate 110) the second electrode 3133 of the initialization transistor T3, and the upper storage electrode 1154 may overlap (e.g., overlap in the thickness direction of the substrate 110) the first electrode 3131 of the initialization transistor T3. The initialization voltage auxiliary pattern 173a and the upper storage electrode 1154 may not overlap (e.g., may not overlap in the thickness direction of the substrate 110) the channel 3132 of the initialization transistor T3.

The driving voltage auxiliary pattern 172a may overlap the driving voltage line 172. The driving voltage auxiliary pattern 172a may be connected with the driving voltage line 172. The driving voltage auxiliary pattern 172a may serve to reduce resistance of the driving voltage line 172. The driving voltage auxiliary pattern 172a may be formed in the shape of a rod extending in the first direction D1. The driving voltage auxiliary pattern 172a may be repeatedly disposed with a disconnected shape in each of the three pixels PX1, PX2, and PX3. The second insulation layer 160 may include an opening 1164 that overlaps the driving voltage auxiliary pattern 172a and the first electrode 1131 of the driving transistor T1. The opening 1164 may be further formed in the first insulation layer 120. The driving voltage auxiliary pattern 172a may be connected with the first electrode 1131 of the driving transistor T1 through the opening 1164. The driving voltage auxiliary pattern 172a may connect the first electrode 1131 of the driving transistor T1 and the driving voltage line 172. Thus, the first electrode 1131 of the driving transistor T1 may receive the driving voltage ELVDD from the driving voltage line 172.

The second common voltage auxiliary pattern 170b may overlap the first common voltage auxiliary pattern 170a. The second common voltage auxiliary pattern 170b may be connected with the first common voltage auxiliary pattern 170a. The second common voltage auxiliary pattern 170b may overlap the common voltage line 170. The second common voltage auxiliary pattern 170b may be connected with the common voltage line 170. Thus, the second common voltage auxiliary pattern 170b may be connected between the common voltage line 170 and the first common voltage auxiliary pattern 170a. The first common voltage auxiliary pattern 170a and the second common voltage auxiliary pattern 170b serve to reduce resistance of the common voltage line 170. The second common voltage auxiliary pattern 170b may be formed in the shape of a rod extending in the first direction D1. The second common voltage auxiliary pattern 170b may be repeatedly disposed with a disconnected shape in each of the three pixels PX1, PX2, and PX3.

A third insulation layer 180 may be disposed on the third conductive layer that includes the first scan line 151, the second scan line 152, and the upper storage electrode 1154.

At least one of the first conductive layer, the second conductive layer, and the third conductive layer may include at least one of metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. Each of the first conductive layer, the second conductive layer, and the third conductive layer may be formed of a single layer or multiple layers. For example, each of the first conductive layer, the second conductive layer, and the third conductive layer may have a multilayer structure including a lower layer including titanium and an upper layer including copper.

At least one of the buffer layer 111, the first insulation layer 120, the second insulation layer 160, and the third insulation layer 180 may include an inorganic insulation material such as a silicon nitride (SiNx), a silicon oxide (SiOx), a silicon oxynitride (SiON), and/or the like, and/or an organic insulation material such as a polyimide, an acryl-based polymer, a siloxane-based polymer, and/or the like.

In one or more exemplary embodiments, a pixel electrode may be disposed on the third insulation layer 180. The pixel electrode may be connected with the driving transistor T1, and may receive an output current of the driving transistor T1. A fourth insulation layer may be disposed on the pixel electrode. An opening is formed in the fourth insulation layer, and the opening of the fourth insulation layer may overlap the pixel electrode. A light emission layer may be disposed on the pixel electrode and the fourth insulation layer, and a common electrode may be disposed on the light emission layer. The pixel electrode, the light emission layer, and the common electrode form a light emitting diode (ED).

Next, the display device according to one or more exemplary embodiments will be described in more detail with reference to FIG. 8.

Figure 8:
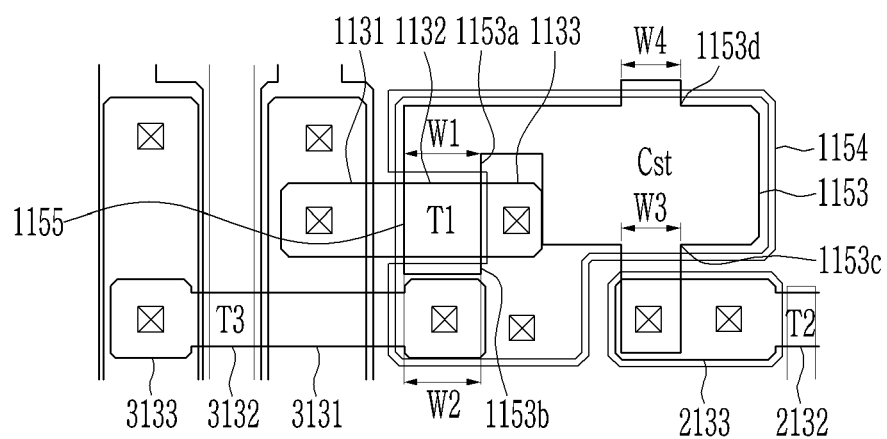
FIG. 8 is a top plan view that illustrates one enlarged pixel of the display device according to one or more exemplary embodiments.

FIG. 8 is a top plan view that illustrates one enlarged pixel of the display device according to one or more exemplary embodiments.

As shown in FIG. 8, the channel 1132 of the driving transistor T1, the channel 2132 of the switching transistor T2, and the channel 3132 of the initialization transistor T3 may be disposed in the semiconductor layer. The channel 1132 of the driving transistor T1, the channel 2132 of the switching transistor T2, and the channel 3132 of the initialization transistor T3 do not overlap (e.g., do not overlap in the thickness direction of the substrate 110) the third conductive layer. That is, top surfaces of the channel 1132 of the driving transistor T1, the channel 2132 of the switching transistor T2, and the channel 3132 of the initialization transistor T3 are not covered by the third conductive layer. For example, the channel 1132 of the driving transistor T1 is not covered by the upper storage electrode 1154. The channel 2132 of the switching transistor T2 is not covered by the first connection electrode 178 or the second connection electrode 179. The channel 3132 of the initialization transistor T3 is not covered by the initialization voltage auxiliary pattern 173a or the upper storage electrode 1154.

Each pixel includes the driving transistor T1, the switching transistor T2, and the initialization transistor T3. When channels of one or more of the transistors T1, T2, and T3 are covered by the third conductive layer, and the channels of one or more of the transistors T1, T2, and T3 are not covered by the third conductive layer, the characteristics of the transistors may be different from each other. In the display device according to the present exemplary embodiment, the channels of the driving transistor T1, the switching transistor T2, and the initialization transistor T3 are not covered by the third conductive layer, and accordingly, each transistor may have the same or similar characteristics.

In the display device according to the present exemplary embodiment, the lower storage electrode 1153 may include a first portion 1153a and a second portion 1153b that are disposed at opposite sides of the gate electrode 1155 of the driving transistor T1 on a plane or in a plan view. For example, the first portion 1153a of the lower storage electrode 1153 may be disposed above the gate electrode 1155 of the driving transistor T1 on a plane or in a plan view, and the second portion 1153b of the lower storage electrode 1153 may be disposed below the gate electrode 1155 on a plane or in a plan view. The first portion 1153a of the lower storage electrode 1153 may be adjacent to the first edge of the channel 1132 of the driving transistor T1, and the second portion 1153b of the lower storage electrode 1153 may be adjacent to the second edge of the channel 1132 of the driving transistor T1. In one or more exemplary embodiments, the first edge and the second edge are opposite edges of the channel 1132 of the driving transistor T1. In this case, the first edge may be a top edge, and the second edge may be a bottom edge. That is, the lower storage electrode 1153 may include the first portion 1153a and the second portion 1153b that respectively protrude upward and downward from the channel 1132 of the driving transistor T1 on a plane or in a plan view. A width W1 of the first portion 1153a of the lower storage electrode 1153 may be equal or substantially equal to a width W2 of the second portion 1153b. The upper storage electrode 1154 may have a shape that surrounds the first edge, the second edge, and the third edge of the channel 1132 of the driving transistor T1 on a plane or in a plan view. For example, the upper storage electrode 1154 may be adjacent the first edge, the second edge, and the third edge of the channel 1132 of the driving transistor T1 on a plane or in a plan view. The upper storage electrode 1154 may overlap (e.g., overlap in the thickness direction of the substrate 110) the first portion 1153a and the second portion 1153b of the lower storage electrode 1153. The upper storage electrode 1154 is separated by a set distance (e.g., predetermined distance) from the third edge of the channel 1132 of the driving transistor T1. That is, the upper storage electrode 1154 has a set distance (e.g., predetermined distance) from the right edge of the gate electrode 1155 of the driving transistor T1.

The lower storage electrode 1153 may include a third portion 1153c connected with the switching transistor T2, and a fourth portion 1153d opposite the third portion 1153c. The third portion 1153c of the lower storage electrode 1153 may overlap (e.g., overlap in the thickness direction of the substrate 110) the second electrode 2133 of the switching transistor T2 by extending from the bottom edge of the lower storage electrode 1153, and may overlap (e.g., overlap in the thickness direction of the substrate 110) the second connection electrode 179. The fourth portion 1153d of the lower storage electrode 1153 may have a shape that protrudes by extending from the top edge of the lower storage electrode 1153. The third portion 1153c that protrudes from the bottom edge of the lower storage electrode 1153 may be referred to as a first protruding portion. The fourth portion 1153d that protrudes from the top edge of the lower storage electrode 1153 may be referred to as a second protruding portion. A width W3 of the third portion 1153c of the lower storage electrode 1153 may be equal to substantially equal to a width W4 of the fourth portion 1153d. The upper storage electrode 1154 may overlap (e.g., overlap in the thickness direction of the substrate 110) the third portion 1153c and the fourth portion 1153d of the lower storage electrode 1153.

The lower storage electrode 1153 and the upper storage electrode 1154 overlap (e.g., overlap in the thickness direction of the substrate 110) each other with the second insulation layer 160 disposed therebetween, such that the capacitor Cst can be formed. Capacitance of the capacitor Cst may be determined by an overlapped area of the lower storage electrode 1153 and the upper storage electrode 1154, a thickness of the second insulation layer 160, and the like. The lower storage electrode 1153 may be disposed in the second conductive layer, and the upper storage electrode 1154 may be disposed in the third conductive layer. That is, the lower storage electrode 1153 and the upper storage electrode 1154 are disposed in different layers, and may be patterned by different masks. In this case, a mask misalignment may occur during a process for forming the second conductive layer and/or a process for forming the third conductive layer, and thus the overlapping relationship between the lower storage electrode 1153 and the upper storage electrode 1154 may be different from the original design. Accordingly, the overlapping area of the lower storage electrode 1153 and the upper storage electrode 1154 is changed, thereby causing a change in capacitance of the capacitor Cst.

In the display device according to the present exemplary embodiment, the lower storage electrode 1153 includes the first portion 1153a and the second portion 1153b that are disposed at opposite sides of the gate electrode 1155 of the driving transistor T1, and thus, even when the mask misalignment occurs, the overlapping area of the lower storage electrode 1153 and the upper storage electrode 1154 can be kept the same or similar. In addition, the lower storage electrode 1153 may include the third portion 1153c that is connected to the switching transistor T2 and the fourth portion 1153d that is opposite the third portion 1153c, and thus, even when the mask misalignment occurs, the overlapping area of the lower storage electrode 1153 and the upper storage electrode 1154 can be kept the same or similar.

Hereinafter, a case where some electrode layers are shifted due to mask misalignment will be described with reference to FIG. 9 and FIG. 10.

Figure 9:
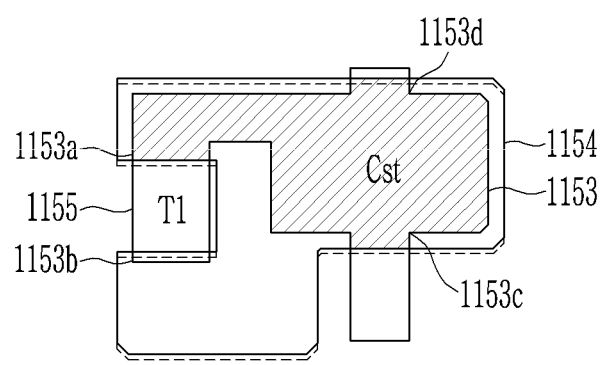
FIG. 9 and FIG. 10 are top plan views of some layers of some area in the display device according to one or more exemplary embodiments.
Figure 10:
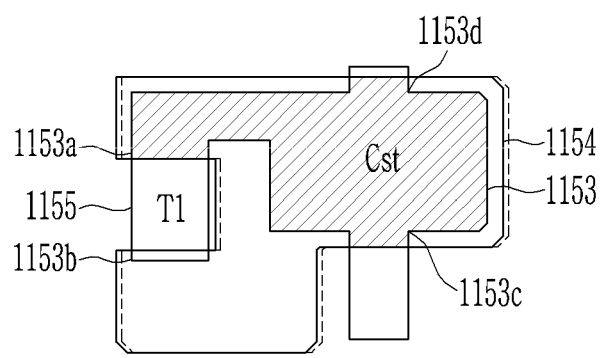

FIG. 9 and FIG. 10 are top plan views of some layers of some area in the display device according to one or more exemplary embodiments. FIG. 9 and FIG. 10 illustrate the gate electrode, the lower storage electrode, and the upper storage electrode of the driving transistor of the display device according to one or more exemplary embodiments.

As shown in FIG. 9, a shift may occur in a vertical direction between the second conductive layer and the third conductive layer due to mask misalignment. The dotted line shows that the third conductive layer is moved in a downward direction on a plane or in a plan view. The overlapped area of the upper storage electrode 1154 and the first portion 1153a of the lower storage electrode 1153 is increased, and the overlapped area of the upper storage electrode 1154 and the second portion 1153b of the lower storage electrode 1153 is decreased. In this case, the width W1 of the first portion 1153a of the lower storage electrode 1153 and the width W2 of the second portion 1153b are equal or substantially equal. Thus, the increase in the overlapped area of the first portion 1153a of the upper storage electrode 1154 and the lower storage electrode 1153 may be equal or substantially equal to the decrease in the overlapped area of the second portion 1153b of the upper storage electrode 1154 and the lower storage electrode 1153. That is, even though a mask misalignment occurs, the total amount of the overlapped area of the upper storage electrode 1154 and the lower storage electrode 1153 can be kept constant or substantially constant at a suitable value, and the capacitance of the capacitor Cst can be kept constant or substantially constant at the suitable value. In addition, the overlapped area of the upper storage electrode 1154 and the third portion 1153c of the lower storage electrode 1153 is increased, and the upper storage electrode 1154 and the fourth portion 1153d of the lower storage electrode 1153 may be decreased. In this case, the width W3 of the third portion 1153c of the lower storage electrode 1153 and the width W4 of the fourth portion 1153d are equal or substantially equal. Thus, the increase in the overlapped area of the third portion 1153c of the upper storage electrode 1154 and the lower storage electrode 1153 may be equal or substantially equal to the decrease in the overlapped area of the fourth portion 1153d of the upper storage electrode 1154 and the lower storage electrode 1153. That is, even though a mask misalignment occurs, the total amount of the overlapped area of the upper storage electrode 1154 and the lower storage electrode 1153 can be kept constant or substantially constant at a suitable value, and the capacitance of the capacitor Cst can be kept constant or substantially constant at the suitable value.

As shown in FIG. 10, a shift may occur in a horizontal direction between the second conductive layer and the third conductive layer due to mask misalignment. The dotted line shows that the third conductive layer is moved in the rightward direction on a plane or in a plan view. It can be observed through the drawing that the overlapped area of the upper storage electrode 1154 and the lower storage electrode 1153 is not changed. In this case, when the right edge of the gate electrode 1155 of the driving transistor T1 is not separated from the upper storage electrode 1154, a portion where the upper storage electrode 1154 and the gate electrode 1155 of the driving transistor T1 overlap (e.g., overlap in the thickness direction of the substrate 110) may be formed when the third conductive layer moves in the leftward direction on a plane or in a plan view. The capacitance of the capacitor Cst may be increased due to the overlapping of the upper storage electrode 1154 and the gate electrode 1155 of the driving transistor T1. In the present exemplary embodiment, because the right edge of the gate electrode 1155 of the driving transistor T1 is separated by a set distance (e.g., predetermined distance) from the upper storage electrode 1154, the upper storage electrode 1154 and the gate electrode 1155 of the driving transistor T1 can be prevented or substantially prevented from being overlapped with each other even though mask misalignment occurs. Thus, the total amount of the overlapped area of the upper storage electrode 1154 and the lower storage electrode 1153 can be kept constant or substantially constant at a suitable value and the capacitance of the capacitor Cst can be kept constant or substantially constant at the suitable value even though the mask misalignment occurs.

Next, a display device according to one or more exemplary embodiments will be described in more detail with reference to FIGS. 11-20.

A display device according to one or more exemplary embodiments shown in FIGS. 11-20 is almost the same as the display device of the one or more exemplary embodiments shown in FIGS. 1-10, and therefore the descriptions of the same parts may not be repeated. One or more exemplary embodiments differ from one or more other exemplary embodiments in that a switching transistor and an initialization transistor are connected to the same scan line as will be further described in more detail below.

Figure 11:
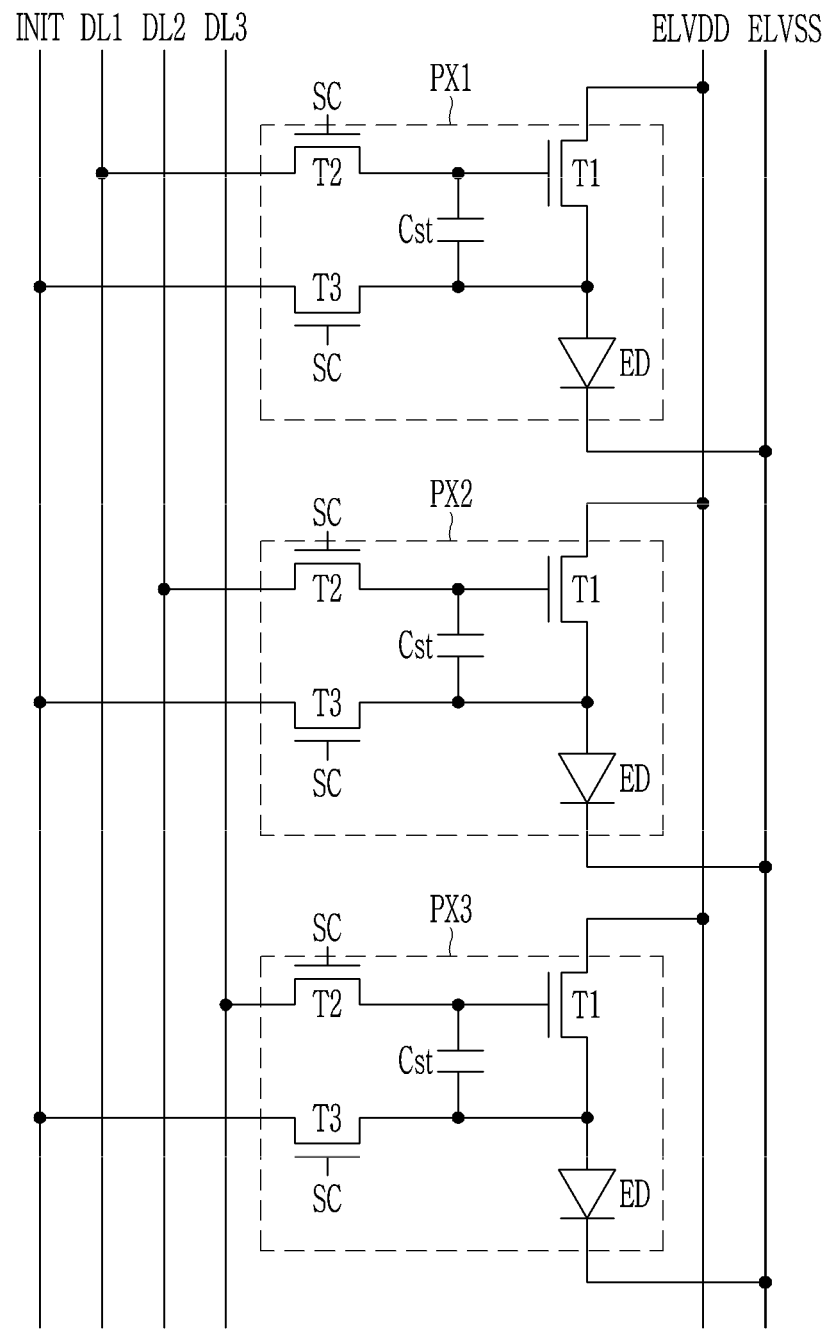
FIG. 11 is a circuit diagram of the display device according to one or more exemplary embodiments.

FIG. 11 is a circuit diagram of the display device according to one or more exemplary embodiments.

As shown in FIG. 11, a plurality of pixels may include a first pixel PX1, a second pixel PX2, and a third pixel PX3. Each of the first pixel PX1, the second pixel PX2, and the third pixel PX3 may include a plurality of transistors T1, T2, and T3, at least one capacitor Cst, and a light emitting diode ED, which is a light emission element.

The plurality of transistors T1, T2, and T3 may include driving transistors T1, switching transistors T2, and initialization transistors T3.

In the previous exemplary embodiment, the gate electrode of the switching transistor T2 is connected to the first scan line that transmits the first scan signal SC, and the gate electrode of the initialization transistor T3 is connected to the second scan line that transmits the second scan signal SS. In the present exemplary embodiment, a gate electrode of the switching transistor T2 is connected to a first scan line that transmits a first scan signal SC, and a gate electrode of the initialization transistor T3 is also connected to the first scan line that transmits the first scan signal SC. That is, the gate electrode of the switching transistor T2 and the gate electrode of the initialization transistor T3 are both connected to the first scan line.

Next, a detailed structure of the display device according to one or more exemplary embodiments will be described in more detail with reference to FIGS. 12-FIG. 17, together with FIG. 11.

Figure 12:
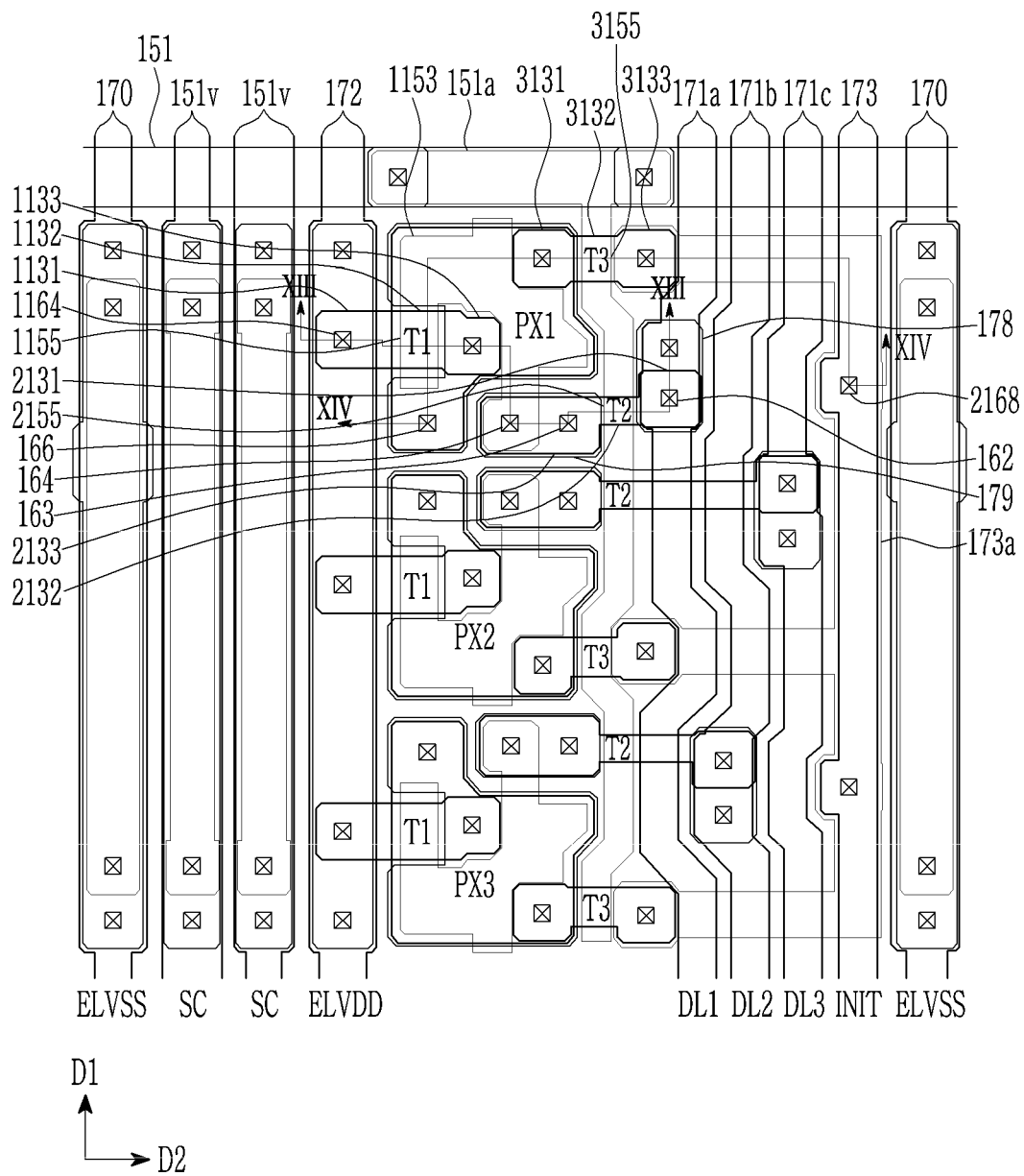
FIG. 12 is a top plan view that illustrates a part of the display device according to one or more exemplary embodiments.
Figure 13:
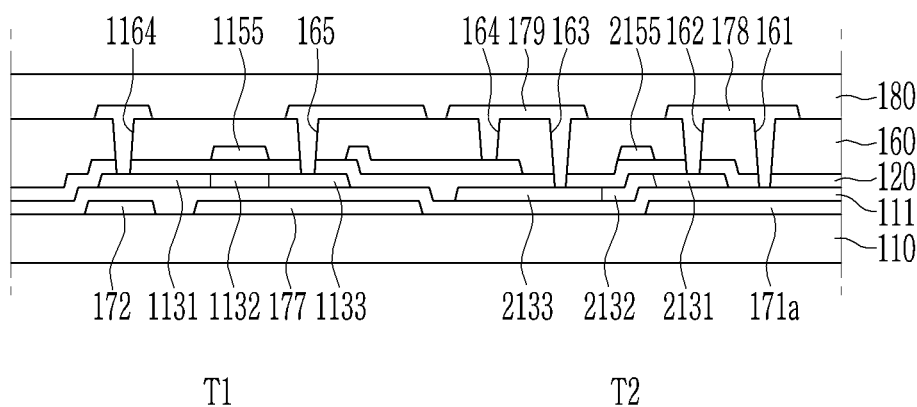
FIG. 13 is a cross-sectional view of the display device of FIG. 12, taken along the line XIII-XIII.
Figure 14:
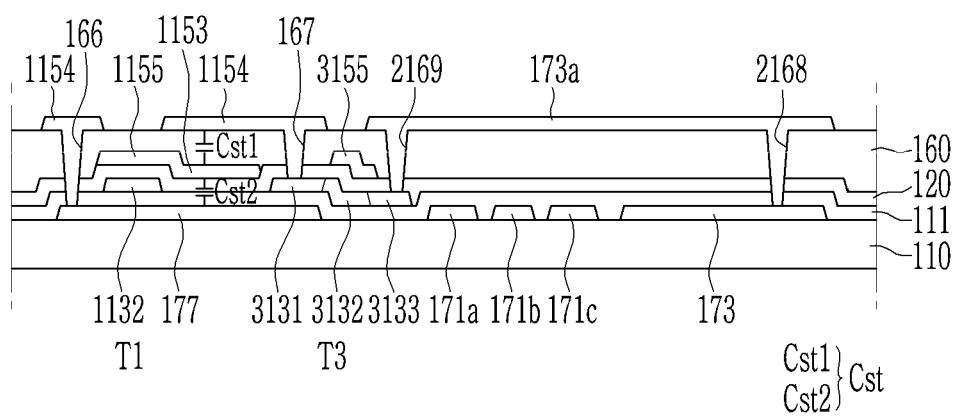
FIG. 14 is a cross-sectional view of the display device of FIG. 12, taken along the line XIV-XIV.
Figure 15:
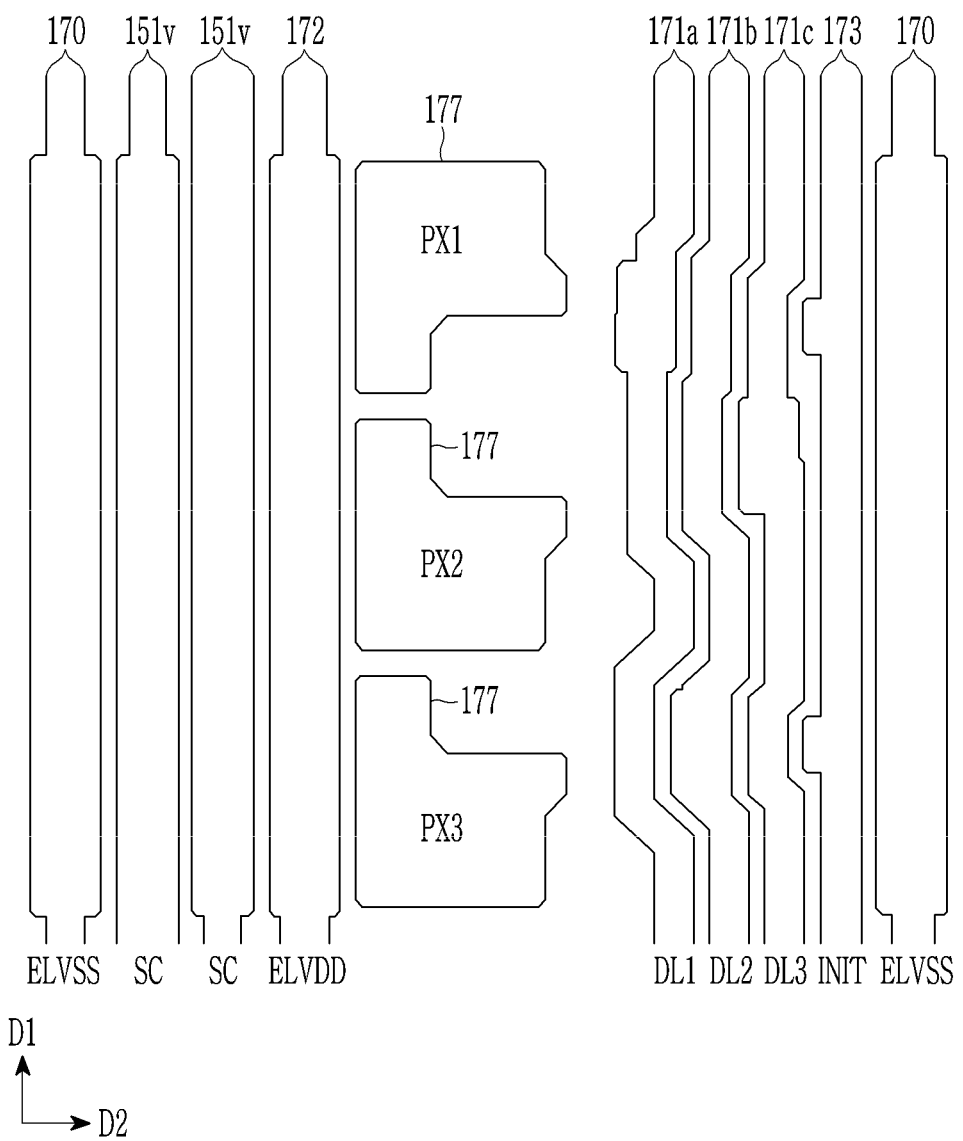
FIGS. 15-17 are top plan views that sequentially illustrate a manufacturing process of the display device according to one or more exemplary embodiments.
Figure 16:
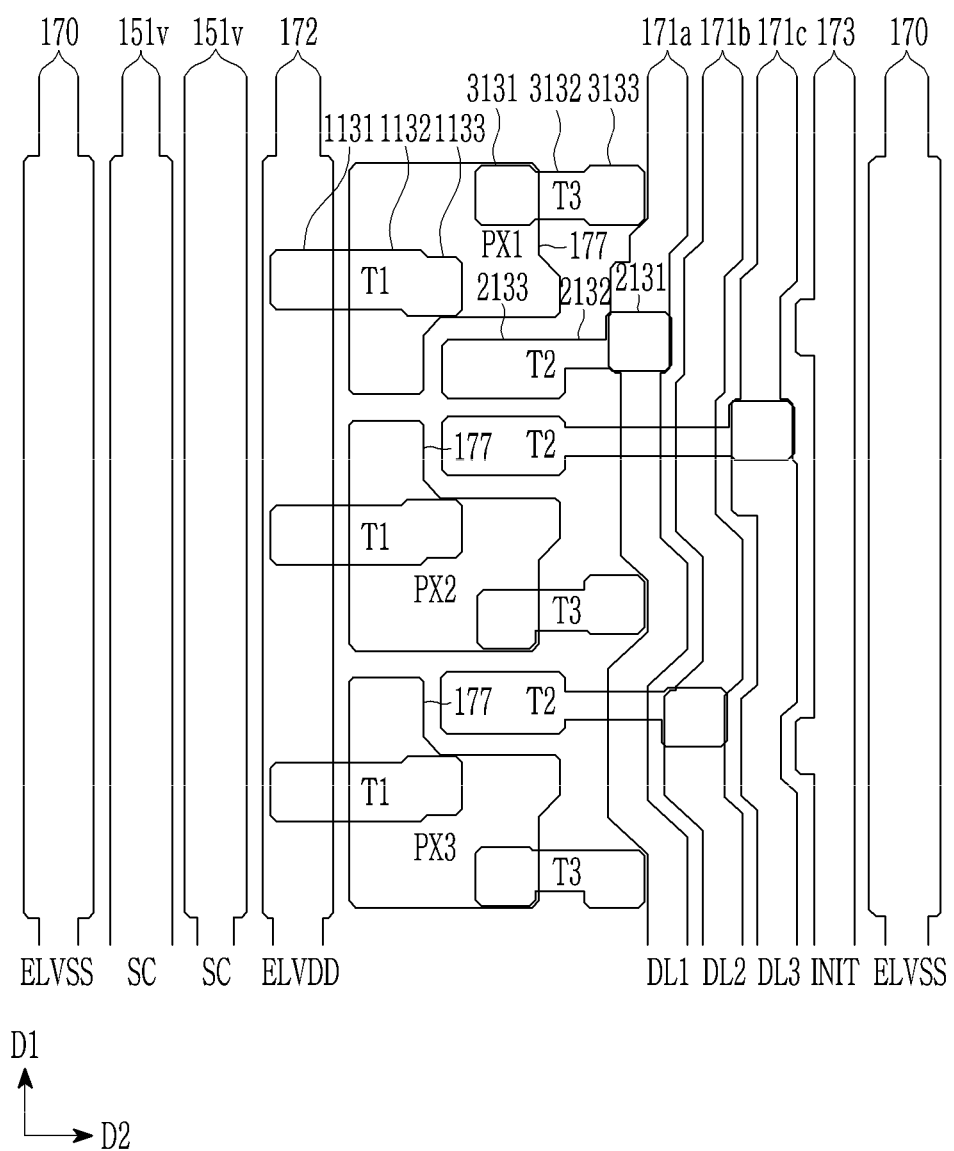
Figure 17:
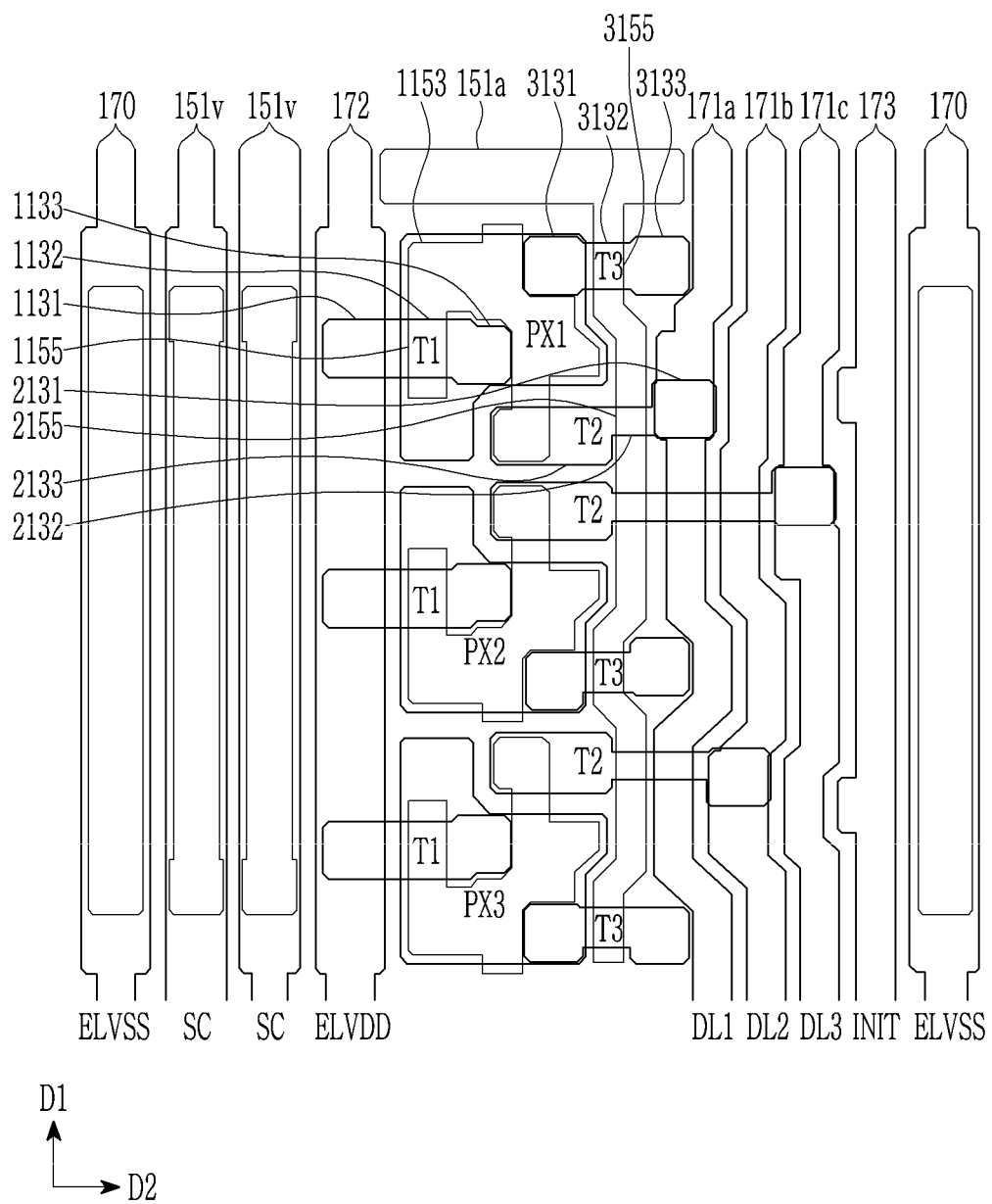

FIG. 12 is a top plan view that illustrates a part of the display device according to one or more exemplary embodiments, FIG. 13 is a cross-sectional view of the display device of FIG. 12, taken along the line XIII-XIII, and FIG. 14 is a cross-sectional view of the display device of FIG. 12, taken along the line XIV-XIV. FIGS. 15-17 are top plan views that sequentially illustrate a manufacturing process of the display device according to one or more exemplary embodiments. FIGS. 12-17 illustrate three adjacent pixels of the display device according to one or more exemplary embodiments, and these pixels may be iteratively arranged.

The display device according to the present exemplary embodiment may include a substrate 110, and a first conductive layer that includes first data lines 171a, second data lines 171b, and third data lines 171c may be disposed on the substrate 110. FIG. 15 illustrates the first conductive layer.

The first data line 171a, the second data line 171b, and the third data line 171c may extend in a first direction D1, and may be disposed to be adjacent to each other along a second direction that crosses the first direction D1.

The first conductive layer may further include common voltage line 170, initialization voltage lines 173, driving voltage lines 172, and a light blocking pattern 177. The common voltage line 170, the initialization voltage line 173, and the driving voltage line 172 may extend in the first direction D1.

In the previous exemplary embodiment, the initialization voltage line 173 may be disposed to be adjacent to the driving voltage line 172, and in the present exemplary embodiment, the initialization voltage line 173 may be disposed to be adjacent to the third data line 171c. In the previous exemplary embodiment, the initialization voltage line 173 may be disposed between the common voltage line 170 and the driving voltage line 172, and in the present exemplary embodiment, the initialization voltage line 173 may be disposed between the third data line 171c and the common voltage line 170.

The first conductive layer may further include a first scan signal transmission line 151v. The first scan signal transmission line 151v may extend in the first direction D1. The first scan signal transmission line 151v may be disposed between the common voltage line 170 and the driving voltage line 172. A plurality of first scan signal transmission lines 151v may be disposed between the common voltage line 170 and the driving voltage line 172 that are disposed adjacent to each other. For example, two first scan signal transmission lines 151v may be disposed between the common voltage line 170 and the driving voltage line 172 that are adjacent to each other. However, the present disclosure is not limited thereto. For example, one first scan signal transmission line 151v may be disposed between the common voltage line 170 and the driving voltage line 172 that are adjacent to each other.

A buffer layer 111, which is an insulation layer, may be disposed on the first conductive layer that includes the first data line 171a, the second data line 171b, the third data line 171c, the common voltage line 170, the initialization voltage line 173, the driving voltage line 172, the light blocking pattern 177, and the first scan signal transmission line 151v.

A semiconductor layer that includes channels 1132, first electrodes 1131, and second electrodes 1133 of driving transistors T1 of the first to third pixels PX1, PX2, and PX3, channels 2132, first electrodes 2131, and second electrodes 2133 of switching transistors T2 of the first to third pixels PX1, PX2, and PX3, and channels 3132, first electrodes 3131, and second electrodes 3133 of initialization transistors T3 may be disposed on the buffer layer 111. FIG. 16 illustrates the first conductive layer and the semiconductor layer.

The switching transistors T2 and the initialization transistors T3 may be disposed adjacent to each other along the first direction D1. The switching transistors T2 and the initialization transistors T3 of the first to third pixels PX1, PX2, and PX3 may be sequentially positioned along the first direction D1. For example, on a plane or in a plan view, the switching transistor T2 of the first pixel PX1 may be disposed below the initialization transistor T3 of the first pixel PX1, the switching transistor T2 of the second pixel PX2 may be disposed below the switching transistor T2 of the first pixel PX1, and the initialization transistor T3 of the second pixel PX2 may be disposed below the switching transistor T2 of the second pixel PX2. In addition, on a plane or in a plan view, the switching transistor T2 of the third pixel PX3 may be disposed below the initialization transistor T3 of the second pixel PX2, and the initialization transistor T3 of the third pixel PX3 may be disposed below the switching transistor T2 of the third pixel PX3.

A first insulation layer 120 may be disposed on the semiconductor layer that includes the channels 1132, the first electrodes 1131, and the second electrodes 1133 of the driving transistors T1 of the first to third pixels PX1, PX2, and PX3, the channels 2132, the first electrodes 2131, and the second electrodes 2133 of the switching transistors T2 of the first to third pixels PX1, PX2, and PX3, and the channels 3132, the first electrodes 3131, and the second electrodes 3133 of the initialization transistors T3.

A second conductive layer that includes gate electrodes 1155 of the driving transistors T1 of the first to third pixels PX1, PX2, and PX3, gate electrodes 2155 of the switching transistors T2 of the first to third pixels PX1, PX2, and PX3, gate electrodes 3155 of the initialization transistors T3 of the first to third pixels PX1, PX2, and PX3, and a lower storage electrode 1153 may be disposed on the first insulation layer 120. FIG. 17 illustrates the first conductive layer, the semiconductor layer, and the second conductive layer.

The second conductive layer may further include a first auxiliary scan pattern 151a. The first auxiliary scan pattern 151a may extend in the second direction D2, may be connected to the gate electrode 2155 of the switching transistor T2 and the gate electrode 3155 of the initialization transistor T3, and may be formed (e.g., integrally formed) with the gate electrode 2155 and the gate electrode 3155.

A second insulation layer 160 may be disposed on the second conductive layer that includes the gate electrode 1155 of the driving transistor T1, the gate electrode 2155 of the switching transistor T2, the gate electrode 3155 of the initialization transistor T3, and the lower storage electrode 1153.

A third conductive layer that includes a first scan line 151 and an upper storage electrode 1154 may be disposed on the second insulation layer 160. FIG. 12 illustrates the first conductive layer, the semiconductor layer, the second conductive layer, and the third conductive layer.

The first scan line 151 extends in the second direction D2. The first scan line 151 may overlap the first auxiliary scan pattern 151a. The first scan line 151 may be connected to the first auxiliary scan pattern 151a. The first scan line 151 may be applied with the first scan signal SC. The first scan line 151 may be connected with the gate electrode 2155 of the switching transistors T2 and the gate electrodes 3155 of the initialization transistors T3 through the first auxiliary scan pattern 151a. Thus, the gate electrode 2155 of the switching transistor T2 and the gate electrode 3155 of the initialization transistor T3 may receive the first scan signal SC from the first scan line 151.

The upper storage electrode 1154 may overlap the lower storage electrode 1153, the second electrode 1133 of the driving transistor T1, the light blocking pattern 177, and the first electrode 3131 of the initialization transistor T3.

The upper storage electrode 1154 may not overlap (e.g., may not overlap in the thickness direction of the substrate 110) the channel 1132 of the driving transistor T1. The channel 1132 of the driving transistor T1 may be formed in the shape of a polygon that includes a first edge, a second edge, a third edge, and a fourth edge on a plane or in a plan view. For example, the channel 1132 of the driving transistor T1 may be formed in the shape of a quadrangle. The first edge and the second edge may be opposite each other. The third edge and the fourth edge may be opposite each other. The third edge may connect the first edge and the second edge. The fourth edge may connect the first edge and the second edge. On a plane or in a plan view, the first edge may be the top edge, the second edge may be the bottom edge, the third edge may be the right edge, and the fourth edge may be the left edge. The upper storage electrode 1154 may have a shape that surrounds the first edge, the second edge, and the third edge of the channel 1132 of the driving transistor T1 on a plane or in a plan view. For example, the upper storage electrode 1154 may be adjacent to the first edge, the second edge, and the third edge of the channel 1132 of the driving transistor T1 on a plane or in a plan view. The upper storage electrode 1154 may have a shape that does not surround the fourth edge of the channel 1132 of the driving transistor T1 on a plane or in a plan view. The upper storage electrode 1154 may be separated by a set distance (e.g., predetermined distance) from the third edge of the channel 1132 of the driving transistor T1 on a plane or in a plan view.

The third conductive layer may further include a first connection electrode 178, a second connection electrode 179, an initialization voltage auxiliary pattern 173a, a driving voltage auxiliary pattern 172a, and a second common voltage auxiliary pattern 170b.

The initialization voltage auxiliary pattern 173a may overlap the initialization voltage line 173. The second insulation layer 160 may include an opening 2168 that overlaps the initialization voltage line 173 and the initialization voltage auxiliary pattern 173a. The opening 2168 may be further formed in the first insulation layer 120 and the buffer layer 111. The initialization voltage auxiliary pattern 173a may be connected with the initialization voltage line 173 through the opening 2168. The initialization voltage auxiliary pattern 173a may overlap the second electrode 3133 of the initialization transistor T3. The second insulation layer 160 may include an opening 2169 that overlaps the second electrode 3133 of the initialization transistor T3 and the initialization voltage auxiliary pattern 173a. The opening 2169 may be further formed in the first insulation layer 120. The initialization voltage auxiliary pattern 173a may be connected with the second electrode 3133 of the initialization transistor T3 through the opening 2169. The initialization voltage auxiliary pattern 173a may be connected between the initialization voltage line 173 and the second electrode 3133 of the initialization transistor T3. The initialization voltage auxiliary pattern 173a includes a portion that extends in the first direction D1, and thus overlaps the initialization voltage line 173, and a portion that extends in the second direction D2 from the portion which extends in the first direction D1, and thus overlaps the initialization voltage line 173, and overlaps the first data line 171a, the second data line 171b, the third data line 171c, and the second electrode 3133 of the initialization transistor T3. That is, the initialization voltage auxiliary pattern 173a is branched at each of the pixels PX1, PX2, and PX3 from the portion extended in the first direction D1, and then is extended in the second direction D2. In other words, the initialization voltage auxiliary pattern 173a extends in the second direction D2 to each of the pixels PX1, PX2, and PX3 from the portion extended in the first direction D1.

A third insulation layer 180 may be disposed on the third conductive layer that includes the first scan line 151, the second scan line 152, and the upper storage electrode 1154.

Next, the display device according to one or more exemplary embodiments will be described in more detail with reference to FIG. 18.

Figure 18:
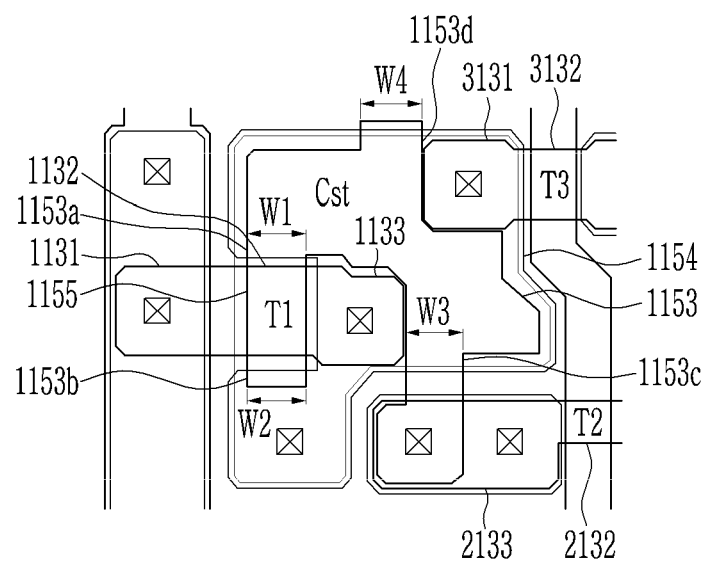
FIG. 18 is a top plan view of a pixel of the display device according to one or more exemplary embodiments.

FIG. 18 is a top plan view of a pixel of the display device according to one or more exemplary embodiments.

As shown in FIG. 18, the channel 1132 of the driving transistor T1, the channel 2132 of the switching transistor T2, and the channel 3132 of the initialization transistor T3 may be disposed in the semiconductor layer. The channel 1132 of the driving transistor T1, the channel 2132 of the switching transistor T2, and the channel 3132 of the initialization transistor T3 do not overlap (e.g., do not overlap in the thickness direction of the substrate 110) the third conductive layer. That is, top surfaces of the channel 1132 of the driving transistor T1, the channel 2132 of the switching transistor T2, and the channel 3132 of the initialization transistor T3 are not covered by the third conductive layer. For example, the channel 1132 of the driving transistor T1 is not covered by the upper storage electrode 1154. The channel 2132 of the switching transistor T2 is not covered by the first connection electrode 178 or the second connection electrode 179. The channel 3132 of the initialization transistor T3 is not covered by the initialization voltage auxiliary pattern 173a or the upper storage electrode 1154.

Each pixel includes the driving transistor T1, the switching transistor T2, and the initialization transistor T3. When channels of one or more of the transistors T1, T2, and T3 are covered by the third conductive layer, and the channels of one or more transistors T1, T2, and T3 are not covered by the third conductive layer, the characteristics of the transistors may be different from each other. Because the channels of the driving transistor T1, the switching transistor T2, and the initialization transistor T3 are not covered by the third conductive layer in the present exemplary embodiment, characteristics of each transistor may be the same or similar.

The lower storage electrode 1153 in the display device according to the present exemplary embodiment may include a first portion 1153a and a second portion 1153b that are disposed at opposite sides of the gate electrode 1155 of the driving transistor T1 on a plane or in a plan view. For example, the first portion 1153a of the lower storage electrode 1153 may be disposed above the gate electrode 1155 of the driving transistor T1, and the second portion 1153b of the lower storage electrode 1153 may be disposed below the gate electrode 1155 of the driving transistor T1 on a plane or in a plan view. The first portion 1153a of the lower storage electrode 1153 may be adjacent to the first edge of the channel 1132 of the driving transistor T1, and the second portion 1153b of the lower storage electrode 1153 may be adjacent to the second edge of the channel 1132 of the driving transistor T1. In one or more exemplary embodiments, the first edge and the second edge are opposite edges of the channel 1132 of the driving transistor T1. In this case, the first edge may be the top edge and the second edge may be the bottom edge. That is, the lower storage electrode 1153 may include the first portion 1153a protruding upward from the channel 1132 of the driving transistor T1, and the second portion 1153b protruding downward from the channel 1132 of the driving transistor T1. A width W1 of the first portion 1153a of the lower storage electrode 1153 may be equal or substantially equal to a width W2 of the second portion 1153b. The upper storage electrode 1154 may have a shape that surrounds the first edge, the second edge, and the third edge of the channel 1132 of the driving transistor T1 on a plane or in a plan view. For example, the upper storage electrode 1154 may be adjacent to the first edge, the second edge, and the third edge of the channel 1132 of the driving transistor T1 on a plane or in a plan view. The upper storage electrode 1154 may overlap (e.g., overlap in the thickness direction of the substrate 110) the first portion 1153a and the second portion 1153b of the lower storage electrode 1153. The upper storage electrode 1154 is separated by a set distance (e.g., predetermined distance) from the third edge of the channel 1132 of the driving transistor T1. That is, the upper storage electrode 1154 is separated by a set distance (e.g., predetermined distance) from the right edge of the gate electrode 1155 of the driving transistor T1.

The lower storage electrode 1153 may include a third portion 1153c that is connected to the switching transistor T2, and a fourth portion 1153d that is opposite the third portion 1153c. The third portion 1153c of the lower storage electrode 1153 may extend from the bottom edge of the lower storage electrode 1153, and thus may overlap (e.g., overlap in the thickness direction of the substrate 110) the second electrode 2133 of the switching transistor T2, and may overlap (e.g., overlap in the thickness direction of the substrate 110) the second connection electrode 179. The fourth portion 1153d of the lower storage electrode 1153 may have a shape that protrudes by extending from the top edge of the lower storage electrode 1153. The third portion 1153c protruding from the bottom edge of the lower storage electrode 1153 may be referred to as a first protruding portion. The fourth portion 1153d protruding from the top edge of the lower storage electrode 1153 may be referred to as a second protruding portion. A width W3 of the third portion 1153c of the lower storage electrode 1153 may be equal or substantially equal to a width W4 of the fourth portion 1153d. The upper storage electrode 1154 may over-lap (e.g., overlap in the thickness direction of the substrate 110) the third portion 1153c and the fourth portion 1153d of the lower storage electrode 1153.

The lower storage electrode 1153 and the upper storage electrode 1154 overlap (e.g., overlap in the thickness direction of the substrate 110) each other with the second insulation layer 160 disposed therebetween such that the capacitor Cst can be formed. Capacitance of the capacitor Cst may be determined by an overlapped area of the lower storage electrode 1153 and the upper storage electrode 1154, a thickness of the second insulation layer 160, and the like. The lower storage electrode 1153 may be disposed in the second conductive layer, and the upper storage electrode 1154 may be disposed in the third conductive layer. That is, the lower storage electrode 1153 and the upper storage electrode 1154 are positioned in different layers, and they may be patterned by different masks. In this case, a mask misalignment may occur during a process for forming the second conductive layer and/or a process for forming the third conductive layer, and thus the overlapping relationship between the lower storage electrode 1153 and the upper storage electrode 1154 may be different from the original design. Accordingly, the overlapping area of the lower storage electrode 1153 and the upper storage electrode 1154 is changed, thereby causing a change in capacitance of the capacitor Cst.

In the display device according to the present exemplary embodiment, the lower storage electrode 1153 includes the first portion 1153a and the second portion 1153b that are disposed at opposite sides of the gate electrode 1155 of the driving transistor T1, and thus, even when the mask misalignment occurs, the overlapping area of the lower storage electrode 1153 and the upper storage electrode 1154 can be kept the same or similar. In addition, the lower storage electrode 1153 may include the third portion 1153c that is connected to the switching transistor T2 and the fourth portion 1153d that is opposite the third portion 1153c, and thus, even when the mask misalignment occurs, the overlapping area of the lower storage electrode 1153 and the upper storage electrode 1154 can be kept the same or similar.

Hereinafter, a case where some electrode layers are shifted due to mask misalignment will be described in more detail with reference to FIG. 19 and FIG. 20.

Figure 19:
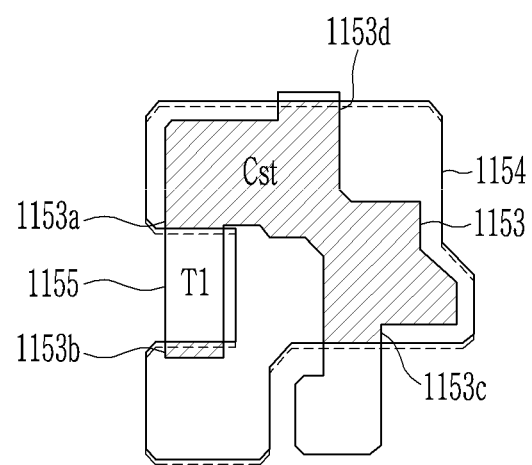
FIG. 19 and FIG. 20 are top plan views of some layers of some area in the display device according to one or more exemplary embodiments.
Figure 20:
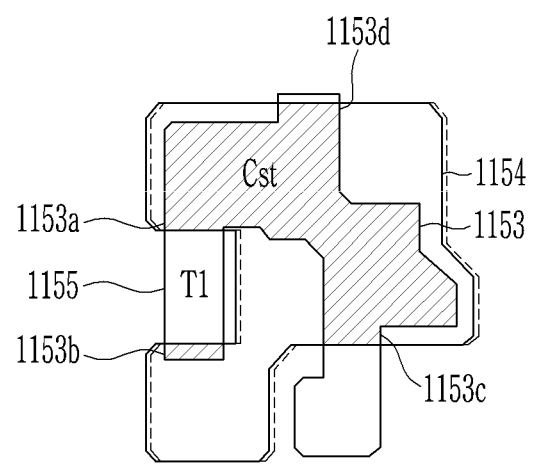

FIG. 19 and FIG. 20 are top plan views of some layers of some area in the display device according to one or more exemplary embodiments. FIG. 19 and FIG. 20 illustrate the gate electrode, the lower storage electrode, and the upper storage electrode of the driving transistor of the display device according to one or more exemplary embodiments.

As shown in FIG. 19, a shift may occur in a vertical direction between the second conductive layer and the third conductive layer due to mask misalignment. The dotted line shows that the third conductive layer is moved in a downward direction on a plane or in a plan view. The overlapped area of the upper storage electrode 1154 and the first portion 1153a of the lower storage electrode 1153 is increased, and the overlapped area of the upper storage electrode 1154 and the second portion 1153b of the lower storage electrode 1153 is decreased. In this case, the width W1 of the first portion 1153a of the lower storage electrode 1153 and the width W2 of the second portion 1153b are equal or substantially equal. Thus, the increase in the overlapped area of the first portion 1153a of the upper storage electrode 1154 and the lower storage electrode 1153 may be equal or substantially equal to the decrease in the overlapped area of the second portion 1153b of the upper storage electrode 1154 and the lower storage electrode 1153. That is, even though a mask misalignment occurs, the total amount of the overlapped area of the upper storage electrode 1154 and the lower storage electrode 1153 can be kept constant or substantially constant at a suitable value, and the capacitance of the capacitor Cst can be kept constant or substantially constant at the suitable value. In addition, the overlapped area of the upper storage electrode 1154 and the third portion 1153*c* of the lower storage electrode 1153 is increased, and the upper storage electrode 1154 and the fourth portion 1153*d* of the lower storage electrode 1153 may be decreased. In this case, the width W3 of the third portion 1153*c* of the lower storage electrode 1153 and the width W4 of the fourth portion 1153*d* are equal or substantially equal. Thus, the increase in the overlapped area of the third portion 1153*c* of the upper storage electrode 1154 and the lower storage electrode 1153 may be equal or substantially equal to the decrease in the overlapped area of the fourth portion 1153*d* of the upper storage electrode 1154 and the lower storage electrode 1153. That is, even though a mask misalignment occurs, the total amount of the overlapped area of the upper storage electrode 1154 and the lower storage electrode 1153 can be kept constant or substantially constant at a suitable value, and the capacitance of the capacitor Cst can be kept constant or substantially constant at the suitable value.

As shown in FIG. 20, a shift may occur in a horizontal direction between the second conductive layer and the third conductive layer due to mask misalignment. The dotted line shows that the third conductive layer is moved in the rightward direction on a plane or in a plan view. It can be observed through the drawing that the overlapped area of the upper storage electrode 1154 and the lower storage electrode 1153 is not changed. In this case, when the right edge of the gate electrode 1155 of the driving transistor T1 is not separated from the upper storage electrode 1154, a portion where the upper storage electrode 1154 and the gate electrode 1155 of the driving transistor T1 overlap (e.g., overlap in the thickness direction of the substrate 110) may be formed when the third conductive layer moves in the leftward direction on a plane or in a plan view. The capacitance of the capacitor Cst may be increased due to the overlapping of the upper storage electrode 1154 and the gate electrode 1155 of the driving transistor T1. In the present exemplary embodiment, because the right edge of the gate electrode 1155 of the driving transistor T1 is separated by a set distance (e.g., predetermined distance) from the upper storage electrode 1154, the upper storage electrode 1154 and the gate electrode 1155 of the driving transistor T1 can be prevented or substantially prevented from being overlapped with each other even though mask misalignment occurs. Thus, the total amount of the overlapped area of the upper storage electrode 1154 and the lower storage electrode 1153 can be kept constant or substantially constant at a suitable value and the capacitance of the capacitor Cst can be kept constant or substantially constant at the suitable value even though the mask misalignment occurs.

Next, a cross-sectional structure of the display device according to one or more exemplary embodiments will be described in more detail with reference to FIG. 21.

The above described FIGS. 1-20 will be referred to together therewith. In FIGS. 1-20, the third insulation layer is described as the topmost layer, but another layer may be further disposed on the third insulation layer and this will be described hereinafter.

Figure 21:
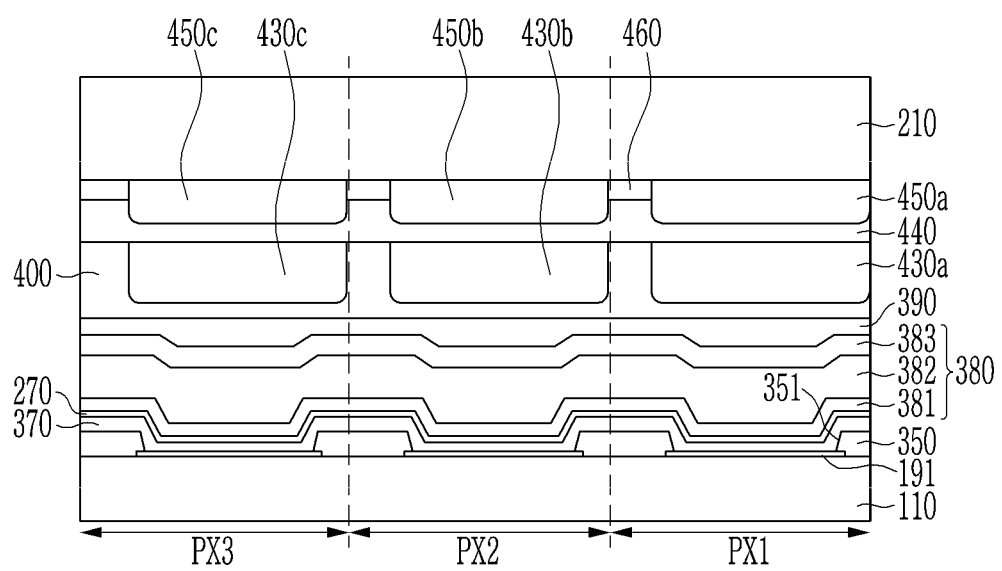
FIG. 21 is a cross-sectional view of some constituent elements of a display device according to one or more exemplary embodiments.

FIG. 21 is a cross-sectional view of some constituent elements of a display device according to one or more exemplary embodiments. In FIG. 21, the scan line, the driving voltage line, and the transistor of the display device according to the one or more above-described exemplary embodiments are illustrated, and constituent elements disposed on the third insulation layer are illustrated.

As shown in FIG. 21, a display device according to an exemplary embodiment may include a plurality of pixels PX1, PX2, and PX3. Pixel electrodes 191 may be disposed in each of the pixels PX1, PX2, and PX3 on a substrate 110. A plurality of transistors and insulation layers that are disposed between the substrate 110 and the pixel electrodes 191 may be present, and for example, may be arranged as shown in FIGS. 1-20.

A fourth insulation layer 350 may be disposed on the pixel electrodes 191, and the fourth insulation layer 350 may include an opening 351. A light emission layer 370 may be disposed on the pixel electrodes 191, and a common electrode 270 may be disposed on the light emission layer 370. The light emission layer 370 may include a light emitting material that emits light of a first color, which may be blue.

An encapsulation layer 380 that includes a plurality of insulation layers 381, 382, and 383 may be disposed on the common electrode 270. The insulation layer 381 and the insulation layer 383 may include an inorganic insulating material, and the insulation layer 382 that is disposed between the insulation layer 381 and the insulation layer 383 may include an organic insulating material.

A filling layer 390 containing a filling agent may be disposed on the encapsulation layer 380. An overcoat 400 that includes an insulating material, a plurality of color conversion layers 430*a* and 430*b*, and a transmission layer 430*c* may be disposed on the filling layer 390.

The transmission layer 430*c* may pass incident light. That is, the transmission layer 430*c* may transmit light of a first color, which may be blue light. The transmission layer 430*c* may include a polymer material that transmits the light of the first color. The area in which the transmission layer 430*c* is disposed may correspond to a light emission area that emits blue light, and the transmission layer 430*c* may pass incident first color light without including separate semiconductor nanocrystals.

The color conversion layers 430*a* and 430*b* may include different semiconductor nanocrystals. For example, the first color light incident on the color conversion layer 430*a* may be converted into light of a second color by the semiconductor nanocrystals included in the color conversion layer 430*b* and then emitted. The first color light incident on the color conversion layer 430*b* may be converted into light of a third color by the semiconductor nanocrystals included in the color conversion layer 430*b* and then emitted.

The semiconductor nanocrystals may include at least one of a phosphor and quantum dot materials that convert incident first color light into second color light or third color light.

The core of the quantum dot may be selected from a Group II-VI compound, a Group III-V compound, a Group IV-VI compound, a Group IV element, a Group IV compound, and a combination thereof.

The Group II-VI compound may be selected from a group consisting of a two-element compound selected from a group consisting of CdSe, CdTe, ZnS, ZnSe, ZnTe, ZnO, HgS, HgSe, HgTe, MgSe, MgS, and a mixture thereof; a three-element compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a group consisting of a two-element compound selected from a group consisting of GaN, GaP, GaAs, GaSb, AlN, AlP, AlAs, AlSb, InN, InP, InAs, InSb, and a mixture thereof; a three-element compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a group consisting of a two-element compound selected from a group consisting of SnS, SnSe, SnTe, PbS, PbSe, PbTe, and a mixture thereof; a three-element compound selected from a group consisting of SnSeS, SnSeTe, SnSTe, PbSeS, PbSeTe, PbSTe, SnPbS, SnPbSe, SnPbTe, and a mixture thereof; and a four-element compound selected from a group consisting of SnPbSSe, SnPbSeTe, SnPbSTe, and a mixture thereof. The Group IV element may be selected from a group consisting of Si, Ge, and a mixture thereof. The Group IV compound may be a two-element compound selected from a group consisting of SiC, SiGe, and a mixture thereof.

In this case, the two-element compound, the three-element compound, or the four-element compound may exist in a particle form at a uniform or substantially uniform concentration, or may exist in the same particle as the concentration distribution is partially divided into different states. In addition, one quantum dot may have a core/shell structure surrounding another quantum dot. The interface between the core and the shell may have a concentration gradient that decreases toward the center (e.g., center of the core) of the concentration of elements present in the shell.

In some exemplary embodiments, the quantum dots may have a core-shell structure including a core including the above-described nanocrystals and a shell surrounding the core. The shell of the quantum dot may serve as a protective layer for maintaining semiconductor characteristics by preventing or reducing chemical degeneration of the core and/or as a charging layer for imparting electrophoretic characteristics to the quantum dots. The shell may be a single layer or multiple layers. The interface between the core and the shell may have a concentration gradient that decreases toward the center (e.g., center of the core) of the concentration of elements present in the shell. Examples of the shell of the quantum dot include a metal or non-metal oxide, a semiconductor compound, or a combination thereof.

For example, the metal or non-metal oxide may exemplarily include a two-element compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, and the like, or a three-element compound such as $MgAl_2O_4$, $CoFe_2O_4$, $NiFe_2O_4$, $CoMn_2O_4$, and the like, but the present disclosure is not limited thereto.

In addition, the semiconductor compound may exemplarily include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the present disclosure is not limited thereto.

The quantum dots may have a full width of half maximum (FWHM) of a light emitting wavelength spectrum of about 45 nm or less, preferably about 40 nm or less, and more preferably about 30 nm or less, and may improve color purity or color reproducibility in this range. In addition, because light emitted through the quantum dots is emitted in all directions, a light viewing angle may be improved.

In addition, the shape of the quantum dot is a shape that is generally used in the art and is not particularly limited, but more specifically, spherical, pyramidal, multi-arm, or cubic nanoparticles, nanotubes, nanowires, nanofibers, nano plate-like particles, etc. may be used.

The quantum dots may control the color of light emitted according to particle size, and accordingly, quantum dots may have various light emitting colors such as blue, red, and green.

An insulation layer 440 may be disposed on the plurality of color conversion layers 430a and 430b and the transmission layer 430c, and a plurality of color filters 450a, 450b, and 450c and a light blocking member 460 may be disposed on the insulation layer 440.

The color filter 450a may represent the second color light, the color filter 450b may represent the third color light, and the color filter 450c may represent the first color light.

The light blocking member 460 may be disposed between adjacent color filters 450a, 450b, and 450c.

A substrate 210 may be disposed on the plurality of color filters 450a, 450b, and 450c and the light blocking member 460. That is, the plurality of color conversion layers 430a and 430b and the plurality of color filters 450a, 450b, and 450c may be disposed between (e.g., between in the thickness direction of the substrate 110) the substrate 110 and the substrate 210.

According to another exemplary embodiment, the light emission layer 370 may include quantum dots instead of including the plurality of color conversion layers 430a and 430b and the transmission layer 430c.

While the present disclosure has been particularly shown and described with reference to some exemplary embodiments thereof, it will be understood by those of ordinary skill in the art that various changes in form and details may be made therein without departing from the spirit and scope of the present disclosure as set forth in the following claims and their equivalents.

| Description of some of the reference symbols | |
| --- | --- |
| 110: substrate | 1131: first electrode of driving transistor |
| 1132: channel of driving transistor | |
| 1133: second electrode of driving transistor | |
| 1153: lower storage electrode | |
| 1153a: first portion of lower storage electrode | |
| 1153b: second portion of lower storage electrode | |
| 1153c: third portion of lower storage electrode | |
| 1153d: fourth portion of lower storage electrode | |
| 1154: upper storage electrode | |
| 1155: gate electrode of driving transistor | |

-continued

| Description of some of the reference symbols | |
|---|---|
| 151: first scan line | 152: second scan line |
| 170: common voltage line | 171a: first data line |
| 171b: second data line | 171c: third data line |
| 172: driving voltage line | 173: initialization voltage line |
| 177: light blocking pattern | |
| 178: first connection electrode | 179: second connection electrode |
| T1: driving transistor | T2: switching transistor |
| T3: initialization transistor | Cst: capacitor |

What is claimed is:

1. A display device comprising:
a substrate;
a driving voltage line on the substrate;
a data line on the substrate;
a semiconductor layer comprising a first electrode of a driving transistor, a channel of the driving transistor, and a second electrode of the driving transistor, the driving transistor being connected to the driving voltage line;
a gate electrode of the driving transistor overlapping the channel of the driving transistor;
a lower storage electrode extending from the gate electrode of the driving transistor; and
an upper storage electrode overlapping the lower storage electrode,
wherein the semiconductor layer further comprises a first electrode of a switching transistor, a channel of the switching transistor, and a second electrode of the switching transistor, the switching transistor being connected between the lower storage electrode and the data line,
wherein the upper storage electrode surrounds at least two side of, and does not overlap, the channel of the driving transistor in a plan view,
wherein the lower storage electrode comprises a first portion disposed at a first side of the gate electrode of the driving transistor and a second portion disposed at a second side of the gate electrode of the driving transistor facing the first side,
wherein both edges of the first portion, both edges of the second portion, and both edges of the gate electrode of the driving transistor overlap, and
wherein the upper storage electrode overlaps the first portion of the lower storage electrode and the second portion of the lower storage electrode.

2. The display device of claim 1, wherein the channel of the driving transistor has a polygonal shape, the channel of the driving transistor including a first edge and a second edge opposite each other, a third edge connecting the first edge and the second edge, and a fourth edge opposite the third edge,
wherein the first portion of the lower storage electrode is adjacent to the first edge of the channel of the driving transistor,
wherein the second portion of the lower storage electrode is adjacent to the second edge of the channel of the driving transistor, and
wherein the upper storage electrode is adjacent to the first edge, the second edge, and the third edge of the channel of the driving transistor in a plan view.

3. The display device of claim 2, wherein the first portion of the lower storage electrode is substantially equal in width to the second portion of the lower storage electrode.

4. The display device of claim 2, wherein the upper storage electrode does not surround the fourth edge of the channel of the driving transistor in the plan view, and is spaced apart from the third edge of the channel of the driving transistor in the plan view.

5. The display device of claim 2, wherein the lower storage electrode further comprises a third portion connected to the switching transistor, and a fourth portion opposite the third portion, and
wherein the upper storage electrode overlaps the third portion of the lower storage electrode and the fourth portion of the lower storage electrode.

6. The display device of claim 5, further comprising a gate electrode overlapping the channel of the switching transistor,
wherein the first electrode of the switching transistor is connected to the data line,
wherein the second electrode of the switching transistor is connected to the lower storage electrode,
wherein the channel of the switching transistor is between the first electrode of the switching transistor and the second electrode of the switching transistor,
wherein the third portion of the lower storage electrode overlaps the second electrode of the switching transistor by extending from a bottom edge of the lower storage electrode in the plan view, and
wherein the fourth portion of the lower storage electrode extends from a top edge of the lower storage electrode in the plan view.

7. The display device of claim 6, wherein the third portion of the lower storage electrode is substantially equal in width to the fourth portion of the lower storage electrode.

8. The display device of claim 6, further comprising:
a first connection electrode connecting the first electrode of the switching transistor and the data line; and
a second connection electrode connecting the switching transistor and the lower storage electrode,
wherein the first connection electrode and the second connection electrode do not overlap the channel of the switching transistor.

9. The display device of claim 8, wherein the first connection electrode, the second connection electrode, and the upper storage electrode are at a same layer.

10. The display device of claim 6, further comprising:
an initialization voltage line on the substrate;
an initialization transistor connected between the initialization voltage line and the upper storage electrode; and
an initialization voltage auxiliary pattern connecting the initialization transistor and the initialization voltage line,
wherein the initialization transistor comprises:
a first electrode connected to the upper storage electrode;

a second electrode connected to the initialization voltage line;
a channel between the first electrode of the initialization transistor and the second electrode of the initialization transistor; and
a gate electrode overlapping the channel of the initialization transistor, and
wherein the initialization voltage auxiliary pattern and the upper storage electrode do not overlap the channel of the initialization transistor.

11. The display device of claim 10, wherein the initialization voltage auxiliary pattern and the upper storage electrode are at a same layer.

12. The display device of claim 10, wherein the driving voltage line, the data line, and the initialization voltage line extend in parallel along a first direction.

13. The display device of claim 12, further comprising a first scan line extending in a second direction that crosses the first direction,
wherein the first scan line is connected to the gate electrode of the switching transistor and the gate electrode of the initialization transistor.

14. The display device of claim 13, wherein the switching transistor and the initialization transistor are adjacent to each other along the first direction.

15. The display device of claim 12, further comprising a first scan line and a second scan line extending in a second direction crossing the first direction,
wherein the first scan line is connected to the gate electrode of the switching transistor, and
wherein the second scan line is connected to the gate electrode of the initialization transistor.

16. The display device of claim 15, wherein the switching transistor and the initialization transistor are adjacent to each other along the second direction.

17. The display device of claim 1, wherein the data line comprises a first data line, a second data line, and a third data line that are continuously arranged to be adjacent to each other, and
wherein the driving voltage line, the first data line, the second data line, and the third data line extend in parallel along a first direction.

18. The display device of claim 17, further comprising:
a first pixel connected to the driving voltage line and the first data line;
a second pixel connected to the driving voltage line and the second data line; and
a third pixel connected to the driving voltage line and the third data line,
wherein the first pixel, the second pixel, and the third pixel are continuously arranged along the first direction between the driving voltage line and the first data line,
wherein at least one of the first pixel, the second pixel, and the third pixel comprises the driving transistor and the switching transistor.

19. A display device comprising:
a substrate;
a driving voltage line and a data line on the substrate;
a semiconductor layer comprising a first electrode of a driving transistor, a channel of the driving transistor, and a second electrode of the driving transistor, the driving transistor being connected to the driving voltage line;
a gate electrode of the driving transistor overlapping the channel of the driving transistor;
a lower storage electrode extending from the gate electrode of the driving transistor; and
an upper storage electrode overlapping the lower storage electrode,
wherein the semiconductor layer further comprises a first electrode of a switching transistor, a channel of the switching transistor, and a second electrode of the switching transistor, the switching transistor being connected between the lower storage electrode and the data line,
wherein the upper storage electrode surrounds at least two side of, and does not overlap, the channel of the driving transistor in a plan view,
wherein the lower storage electrode comprises a third portion and a fourth portion that are connected to the switching transistor, and
wherein the upper storage electrode overlaps the third portion of the lower storage electrode and the fourth portion of the lower storage electrode.

20. The display device of claim 19, wherein the lower storage electrode further comprises a first portion disposed at a first side of the gate electrode of the driving transistor and a second portion disposed at a second side of the gate electrode of the driving transistor facing the first side, and
wherein the upper storage electrode overlaps the first portion of the lower storage electrode and the second portion of the lower storage electrode.

* * * * *